United States Patent
Kawano et al.

(10) Patent No.: US 7,071,524 B2
(45) Date of Patent: Jul. 4, 2006

(54) SEMICONDUCTOR LIGHT RECEIVING DEVICE FOR REPEATEDLY PROPAGATING INCIDENT LIGHT IN LIGHT ABSORPTION LAYER AND METHOD FOR MANUFACTURING THE SAME

(75) Inventors: Kenji Kawano, Atsugi (JP); Hiroaki Yoshidaya, Atsugi (JP); Jun Hiraoka, Atsugi (JP); Yuichi Sasaki, Atsugi (JP)

(73) Assignee: Anristsu Corporation, Tokyo (JP)

( * ) Notice: Subject to any disclaimer, the term of this patent is extended or adjusted under 35 U.S.C. 154(b) by 365 days.

(21) Appl. No.: 10/369,469

(22) Filed: Feb. 20, 2003

(65) Prior Publication Data

US 2003/0146441 A1 Aug. 7, 2003

Related U.S. Application Data

(63) Continuation of application No. PCT/JP02/04372, filed on May 1, 2002.

(30) Foreign Application Priority Data

| May 7, 2001 | (JP) | ........................................ 2001-136474 |
| Oct. 12, 2001 | (JP) | ........................................ 2001-315625 |

(51) Int. Cl.
  *H01L 31/0232* (2006.01)
  *H01L 31/06* (2006.01)
  *H01L 31/00* (2006.01)

(52) U.S. Cl. ........................ 257/436; 257/461; 257/464; 257/466; 385/124; 385/144; 385/145; 385/146

(58) Field of Classification Search .................. 257/436, 257/461, 464, 466; 385/124, 144, 145, 146
  See application file for complete search history.

(56) References Cited

U.S. PATENT DOCUMENTS

| 5,391,869 A | 2/1995 | Ade et al. |
| 5,940,565 A | 8/1999 | Sugawara |
| 5,980,831 A | * 11/1999 | Braiman et al. ......... 422/82.11 |
| 5,995,690 A | * 11/1999 | Kotz et al. ..................... 385/25 |
| 6,207,975 B1 | 3/2001 | Tran et al. |

FOREIGN PATENT DOCUMENTS

| JP | 3-290606 A | 12/1991 |
| JP | 7-263740 A | 10/1995 |
| JP | 11-195807 A | 7/1999 |
| JP | 11-261098 A | 9/1999 |
| JP | 2000-243984 A | 9/2000 |
| JP | 2001-53328 A | 2/2001 |
| JP | 2001-111094 A | 4/2001 |

\* cited by examiner

*Primary Examiner*—Ngân V. Ngô
(74) *Attorney, Agent, or Firm*—Frishauf, Holtz, Goodman & Chick, P.C.

(57) ABSTRACT

A lower cladding layer is laminated on a substrate and constituted of at least one layer. A light absorption layer is laminated on the lower cladding layer. An upper cladding layer is laminated above the light absorption layer and constituted of at least one layer. A light incident end surface is provided on at least one of the substrate and the lower cladding layer, and, when a light is made incident at a predetermined angle, enables the light to be absorbed in the light absorption layer and to be output as a current. An equivalent refractive index of the at least one of the substrate and the lower cladding layer is larger than that of the upper cladding layer. The predetermined angle is an angle enabling a light incident into the light absorption layer to be reflected at a lower surface of the upper cladding layer.

23 Claims, 11 Drawing Sheets

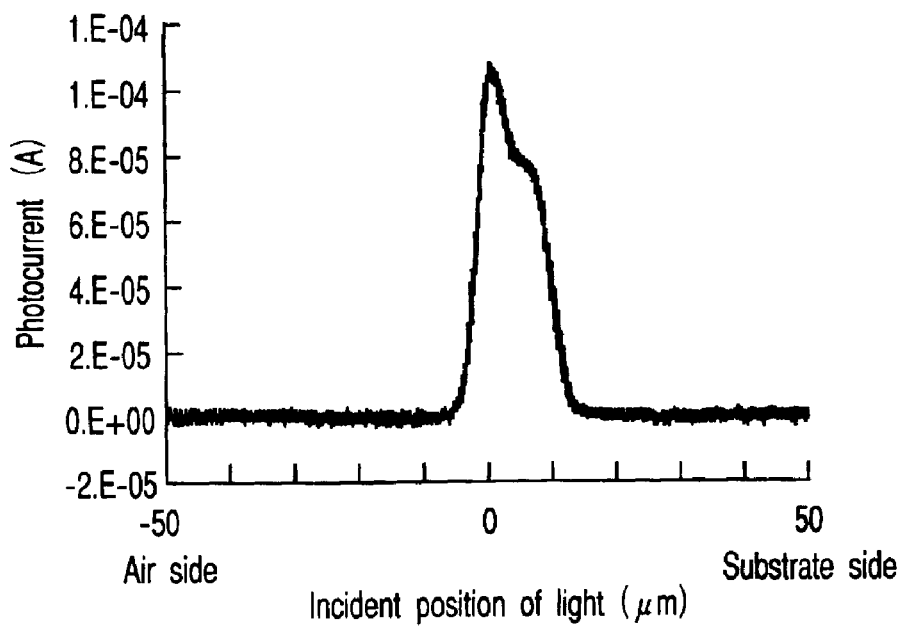
F I G. 10
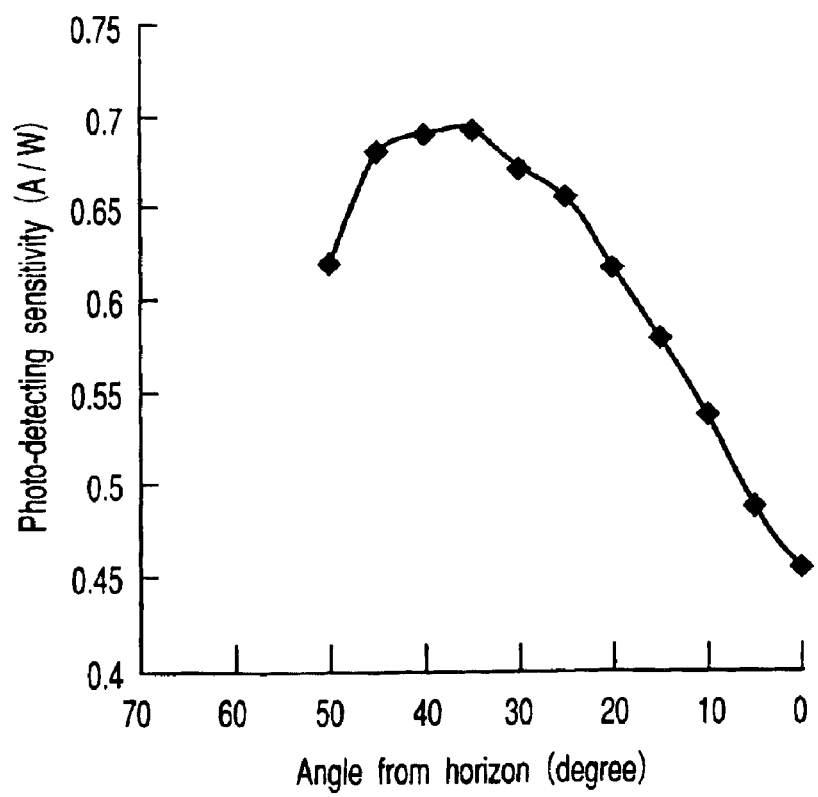
F I G. 11

SEMICONDUCTOR LIGHT RECEIVING DEVICE FOR REPEATEDLY PROPAGATING INCIDENT LIGHT IN LIGHT ABSORPTION LAYER AND METHOD FOR MANUFACTURING THE SAME

CROSS-REFERENCE TO RELATED APPLICATIONS

This is a Continuation Application of PCT Application No. PCT/JP02/04372, filed May 1, 2002, which was not published under PCT Article 21(2) in English.

This application is based upon and claims the benefit of priority from the prior Japanese Patent Applications No. 2001-136474, filed May 7, 2001; and No. 2001-315625, filed Oct. 12, 2001, the entire contents of both of which are incorporated herein by reference.

BACKGROUND OF THE INVENTION

1. Field of the Invention

The present invention relates to a semiconductor light receiving device and a method for manufacturing the same, and particularly to a semiconductor light receiving device for repeatedly propagating an incident light in a light absorption layer and converting it to an electric signal, and a method of manufacturing the same.

2. Description of the Related Art

Conventionally, a semiconductor light receiving device formed by a semiconductor device for converting an optical signal to an electric signal is known.

FIG. 12 is a perspective view showing a constitution of a waveguide type semiconductor light receiving device as such a typical semiconductor light receiving device.

In other words, in this waveguide type semiconductor light receiving device, as shown in FIG. 12, a lower cladding layer 5 made of n-InP is formed on a substrate 6 made of $n^+$-InP.

A light absorption layer 4 made of i-InGaAs, an upper cladding layer 3 made of p-InP, and a contact layer 2 made of $p^+$-InGaAs are formed on the lower cladding layer 5.

A p electrode 1 is attached on an upper surface of the contact layer 2.

Further, an n electrode 7 is attached on a lower surface of the substrate 6.

Furthermore, a polyimide 8 for reducing a capacitance is formed at part of each side surface of the contact layer 2, the upper cladding layer 3, the light absorption layer 4, and the lower cladding layer 5, and a lower portion of the p electrode 1.

The light absorption layer 4 made of i-InGaAs, the upper cladding layer 3 made of p-InP, and the lower cladding layer 5 made of n-InP constitute an optical waveguide for guiding a light incident from a light incident surface of an end surface of the waveguide type semiconductor light receiving device into the inside thereof as shown in FIG. 10.

In this optical waveguide, a refractive index of the light absorption layer 4 is set to be higher than a refractive index of the upper cladding layer 3 and a refractive index of the lower cladding layer 5.

In other words, in the waveguide type semiconductor light receiving device, this light absorption layer 4 functions as a core which plays a main role for guiding the incident light.

In addition, in this waveguide type semiconductor light receiving device, the width of a mesa is on the order of 4 μm, and the length thereof is on the order of 10 μm.

In the waveguide type semiconductor light receiving device constituted in this manner, the incident light is absorbed in the light absorption layer 4 and converted to an electric signal during propagation through the optical waveguide constituted by the light absorption layer 4, the upper cladding layer 3 made of p-InP and the lower cladding layer 5 made of n-InP.

At this time, the light is absorbed according to the formula where the intensity I thereof is expressed by:

$$I = I_0 \exp(-\alpha z) \tag{0}$$

Here, $I_0$ is a power of the incident light at the light incident end surface, α is an absorption coefficient, and z is a distance from the light incident end surface.

FIG. 13 is a diagram showing a relationship between the power I of the light guided through the optical waveguide of the waveguide type semiconductor light receiving device and the distance z.

As can be understood from the formula (0) and FIG. 13, when the light is incident into the waveguide type semiconductor light receiving device, it is exponentially attenuated.

That is, most of the light is absorbed in a short distance during propagating from the light incident end surface of the waveguide type semiconductor light receiving device through the optical waveguide, and is converted to a current.

It can be said that FIG. 13 shows a current generated because the light is absorbed, or Joule heat generated by the current, so that it can be said that, in the waveguide type semiconductor light receiving device as shown in FIG. 12, heat generation rapidly occurs in the short distance from the light incident end surface.

As a result, since, when the power of the light incident into the waveguide type semiconductor light receiving device is large, Joule heat generated in the short distance from the light incident end surface becomes remarkably larger, this waveguide type semiconductor light receiving device can be broken at worst.

Additionally, in the waveguide type semiconductor light receiving device shown in FIG. 12, illustration is omitted for simplifying the description, but actually, quaternary SCH (Separate Confinement Heterostructure) layers of InGaAsP composition having a band gap wavelength of about 1.3 μm are generally intervened above and below the light absorption layer 4 in order to make the optical waveguide multi-modal.

Therefore, it is assumed that the thickness of the light absorption layer 4 is 0.6 μm and the thickness of the SCH layers in total is on the order of 2 μm, in the manufacturing steps of the waveguide type semiconductor light receiving device, the thickness of the crystal to be grown becomes as thick as 3 to 4 μm in total including other layers. Accordingly, the crystal growth itself requires a lot of time and processes such as mesa etching and the like become complicated, which is a factor for restricting a yield in manufacturing.

In order to eliminate such disadvantages, there has been proposed a semiconductor light receiving device of end surface refraction type having a structure as shown in a transverse sectional view of FIG. 14 (refer to Jpn. Pat. Appln. KOKAI Publication No. 11-195807).

Additionally, as the semiconductor light receiving device of end surface refraction type, various structures have been reported, and a typical example will be shown, here.

Specifically, as shown in FIG. 12, the lower cladding layer 5 made of n-InP, the light absorption layer 4 made of i-InGaAs, the upper cladding layer 3 made of p-InP, and the contact layer 2 made of $p^+$-InGaAs are formed on the substrate 9 made of a semi-insulating InP (SI-IP) material.

The p electrode 1 for extracting the electric signal is attached at an upper side of this contact layer 2.

Similarly, the n type electrode 7 for extracting the electric signal is attached at the lower cladding layer 5 made of n-InP.

In such a semiconductor light receiving device of an end surface refraction type, as shown in FIG. 14, the light incident end surface 10 formed by the end surfaces of the substrate 9 and the lower cladding layer 5 is formed in an inclined manner by wet etching.

In this case, an inclination angle with respect to the upper surface (lower surface of the light absorption layer 4) of the lower cladding layer 5 of the light incident end surface 10 is about 54° from the orientation property of the crystal at the time of wet etching.

There will be described operation principles of the semiconductor light receiving device of end surface refraction type having such a structure.

After the incident light is refracted at the inclined light incident end surface 10 of the semiconductor light receiving device of end surface refraction type, it is absorbed in the light absorption layer 4 to be converted into the electric signal.

In the case of this semiconductor light receiving device of end surface refraction type, as illustrated, the incident light is incident into the entire light absorption layer 4 from below and is substantially uniformly absorbed in the entire light absorption layer 4. Accordingly, the semiconductor light receiving device of end surface refraction type is more advantageous than the waveguide type semiconductor light receiving device shown in FIG. 12 with respect to device destruction due to the generation of Joule heat.

Further, as can be understood by comparing FIG. 14 and FIG. 12, in the semiconductor light receiving device of end surface refraction type, a structure is employed in which the upper cladding layer 3 made of p-InP, the aforementioned SCH layers, and the like essential for the waveguide type semiconductor light receiving device are not required.

Therefore, as compared with the waveguide type semiconductor light receiving device, in the process of manufacturing this semiconductor light receiving device of an end surface refraction type, it is advantageous that the crystal growth or the process is easy.

In addition, in this semiconductor light receiving device of an end surface refraction type, the width of the mesa is on the order of 7 μm, and the length thereof is on the order of 14 μm.

However, even the semiconductor light receiving device of an end surface refraction type as shown in FIG. 14 has the following problems to be further solved.

Note that, when it is assumed the wavelength of the incident light is 1.55 μm, the problems which this semiconductor light receiving device of an end surface refraction type has will be described.

FIG. 15 is a diagram schematically showing a trace of the center of the light propagated through this semiconductor light receiving device of an end surface refraction type.

That is, as shown in FIG. 15, the incident light is refracted at the light incident end surface 10 of the semiconductor light receiving device of an end surface refraction type.

At this time, from Snell's law at the light incident end surface 10, $$n_0 \sin \theta_1 = n_5 \sin \theta_2 \tag{1}$$

is obtained.

Here, the refractive index $n_0$ of the air is 1 and the angle $\theta_1$ formed by the trace of the center of the incident light and the normal line of the light incident end surface 10 is 36° since the inclination angle of the light incident end surface 10 by wet etching is 54°.

Further, the refractive index $n_5$ of the lower cladding layer 5 made of n-InP is 3.15.

The refractive index of non-doped InP is 3.17, but it is known that the refractive index of n doped InP is lower than this so that $n_5=3.15$ lower than 3.17 is assumed, here.

Therefore, the angle $\theta_2$ formed by the light refracted at the light incident end surface 10 and the normal line of the light incident end surface 10 and the angle $\theta_3$ formed by the refracted light and the horizontal line are $\theta_2=10.8°$, and $\theta_3=25.2°$, respectively, from the formula (1) and $\theta_3=\theta_1-\theta_2$.

Next, there will be considered the incidence from the lower cladding layer 5 made of n-InP into the light absorption layer 4 (refractive index $n_4$).

When Snell's law is employed at an interface between the lower cladding layer 5 made of n-InP and the light absorption layer 4, $$n_5 \sin \theta_4 = n_4 \sin \theta_5 \tag{2}$$

is obtained.

Here, $\theta_4=64.8°$ is obtained from $\theta_4=(\pi/2)-\theta_3$.

It is assumed that the refractive index $n_4$ of the light absorption layer 4 is 3.50, $\theta_5=54.5°$ is obtained from the formula (2).

This is to say, in the inside of the light absorption layer 4, the light propagates towards the upper side at the angle $\theta_6=(\pi/2)-\theta_5=35.5°$ from the horizon.

Therefore, the effective absorption length for the light is $1/\sin \theta_6=1.7$ times of the thickness of the light absorption layer 4.

Additionally, it is assumed that the thickness of the light absorption layer 4 is 0.5 μm, the effective absorption length of 0.86 μm is obtained for the light.

Next, when Snell's law is employed at the interface between the light absorption layer 4 and the upper cladding layer 3 made of p-InP (refractive index $n_3$), $$n_4 \sin \theta_5 = n_3 \sin \theta_7 \tag{3}$$

is obtained.

In the p type semiconductor, a hole is a majority carrier.

Since the hole has a large mass, and the refractive index $n_3$ of the upper cladding layer 3 made of p-InP is generally same as that of non-doped InP, when $n_3=3.17$ is assumed, $\theta_7=64.0°$ is obtained from the formula (3).

In other words, in the inside of the upper cladding layer 3 made of p-InP, the light propagates at the angle $\theta_8=\pi/2-\theta_7=26.0°$ from the horizon.

Thereafter, the light is incident into the contact layer 2 made of $p_+$-InGaAs.

When Snell's law is employed at the interface between the upper cladding layer 3 made of p-InP and the contact layer 2 made of $p_+$-InGaAs (refractive index $n_2$), $$n_3 \sin \theta_7 = n_2 \sin \theta_9 \tag{4}$$

is obtained.

Here, since the contact layer 2 made of $p^+$-InGaAs has the same refractive index $n_2$ as the light absorption layer 4 ($n_2=n_4$), $\theta_9=\theta_5$ is obtained.

That is, also during propagating through the contact layer 2 made of $p^+$-InGaAs, the light is further absorbed in the distance which is $1/\sin \theta_6=1.7$ times of the thickness thereof.

Additionally, when it is assumed that the thickness of the contact layer 2 made of $p^+$-InGaAs is 0.3 μm, the effective absorption length in the contact layer 2 made of $p^+$-InGaAs is 0.52 μm.

However, since this contact layer 2 made of p$^+$-InGaAs is doped at high concentration of $2\times10^{18}$ cm$^{-3}$ to $2\times10^{19}$ cm$^{-3}$ so that the internal electric field is not present, the electron to be extracted from the n electrode 7 cannot reach the n electrode 7.

Therefore, the electron and the hole are recombined, as a result, they are in vain as a current, or cannot follow the high frequency signal so that the frequency response characteristics are deteriorated.

When it is considered that the thickness of the light absorption layer 4 is in the order of 0.5 μm, the thickness of the contact layer 2 made of p$^+$-InGaAs is so thick that it cannot be ignored, deteriorations of the efficiency by the absorption of this contact layer 2 made of p$^+$-InGaAs and the frequency response characteristics are important problems.

Furthermore, in this semiconductor light receiving device of end surface refraction type, in order to incline the light incident end surface 10, wet etching is employed so that a lot of trouble is taken for manufacturing the light receiving device.

In addition, the inclination angle of the light incident end surface 10 formed when wet etching is performed for a sufficiently long time is determined to be substantially 54° from the orientation property of the crystal, but when the time when wet etching is actually performed is so short, this angle cannot be reached and becomes larger than 54° as shown in FIG. 16.

In this case, only part of the light is radiated on the light absorption layer 4 and thereby the efficiency is deteriorated.

On the contrary, when the time when wet etching is performed is so long, the light incident end surface 10 is retreated while this angle of 54° is maintained as shown in FIG. 17 so that the distance L between the light incident end surface 10 and the light absorption layer 4 is shorter than a designed value.

Also in this case, only part of the light is radiated on the light absorption layer 4 and thereby the efficiency is deteriorated.

In the actual manufacture of the semiconductor light receiving device, it is difficult to control this etching, which is a factor that reduces the yield in manufacturing the semiconductor light receiving device of an end surface refraction type.

There has been proposed a semiconductor light receiving device in which a relative angle of the incident light and the light incident end surface 10 is set to be 60° instead of the oblique light incident end surface 10 in the semiconductor light receiving device of end surface refraction type shown in FIG. 14 by forming the light incident end surface 10 by not wet etching but cleaving (refer to Jpn. Pat. Appln. KOKAI Publication No. 2000-243984).

In other words, as shown in FIG. 18, in this semiconductor light receiving device, since the light incident end surface 10 is formed by cleavage, the light incident end surface 10 is orthogonal to the upper surface or the lower surface of the semiconductor light receiving device so that the formation of the light incident end surface 10 is remarkably easy.

In this semiconductor light receiving device, as shown in FIG. 18, the lower cladding layer 5 made of n-InP, the light absorption layer 4 made of i-InGaAs, the upper cladding layer 3 made of p-InP and the contact layer 2 made of n$^+$-InGaAs are formed on the upper surface of the substrate 6 made of n$^+$-InP.

The p electrode 1 is attached on the upper surface of this contact layer 2.

The n electrode 7 is attached on the lower surface of the substrate 6.

This semiconductor light receiving device is fixed by a casing 12.

The light is made incident into the light incident end surface 10 from an optical fiber 11 supported by the casing 12.

The trace of the center of the incident light in the semiconductor light receiving device in which the light incident end surface 10 shown in FIG. 18 is formed by cleavage will be described with reference to FIG. 19.

When it is assumed that the refractive index of the substrate 6 made of n$^+$-InP is $n_6$, the formula derived from Snell's law in the light incident end surface 10 is:

$$n_0 \sin \theta_1 = n_6 \sin \theta_2 \quad (5)$$

Here, according to the literature (Jpn. Pat. Appln. KOKAI Publication No. 2000-243984), when $\theta_1=60.0°$ is assumed, $\theta_2=16.0°$ is obtained using $n_6=3.15$ from the formula (5).

Here, it is assumed that the refractive index $n_5$ of the lower cladding layer 5 made of n-InP is same as the refractive index $n_6$ of the substrate 6 made of n$^+$-InP, that is 3.15, $\theta_4=74.0°$ is obtained.

At the interface between the lower cladding layer 5 made of n-InP and the light absorption layer 4, $$n_5 \sin \theta_4 = n_4 \sin \theta_5 \quad (6)$$

is established so that $\theta_5=59.9°$ is obtained.

Here, the refractive index $n_4$ of the light absorption layer 4 is assumed to be 3.5.

This is to say, in the inside of the light absorption layer 4, the light propagates towards the upper side at the angle $\theta_6=\pi/2-\theta_5=30.1°$ from the horizon.

Therefore, the effective absorption length for the light is $1/\sin \theta_6=2.0$ times of the thickness of the absorption layer 4.

Additionally, it is assumed that the thickness of the light absorption layer 4 is 0.5 μm, the effective absorption length for the light is about 1 μm.

Next, when Snell's law is employed at the interface between the light absorption layer 4 and the upper cladding layer 3 made of p-InP, $$n_4 \sin \theta_5 = n_3 \sin \theta_7 \quad (7)$$

is obtained.

Since the hole has a large mass, the refractive index $n_3$ of the upper cladding layer 3 made of p-InP in which the hole is a majority carrier is same as that of non-doped InP so that, when $n_3=3.17$ is assumed, $\theta_7=72.8°$ is obtained from the formula (7).

In other words, in the inside of the upper cladding layer 3 made of p-InP, the light propagates at the angle $\theta_8=\pi/2-\theta_7=17.2°$ from the horizon.

Thereafter, the light is incident into the contact layer 2 made of p$^+$-InGaAs.

When Snell's law is employed at the interface between the upper cladding layer 3 made of p-InP (refractive index $n_3$) and the contact layer 2 made of p$^+$-InGaAs (refractive index $n_2$), $$n_3 \sin \theta_7 = n_2 \sin \theta_9 \quad (8)$$

is obtained.

Here, the contact layer 2 made of p$^+$-InGaAs has the same refractive index $n_2$ as the light absorption layer 4 ($n_2=n_4$) so that $\theta_9=\theta_5$ is immediately obtained.

Specifically, also during propagation through the contact layer 2 made of p$^+$-InGaAs, the light is further absorbed in the distance which is $1/\sin \theta_6=2.0$ times the thickness thereof.

Additionally, when it is assumed that the thickness of the contact layer 2 made of p⁺-InGaAs is 0.3 μm, the effective absorption length in the contact layer 2 made of p⁺-InGaAs is 0.60 μm.

However, this contact layer 2 made of p⁺-InGaAs is doped at a high concentration of $2\times10^{18}$ cm⁻³ to $2\times10^{19}$ cm⁻³ so that the electric field is not applied.

Accordingly, as described above, the generated electron and the carrier such as the hole are recombined so that they are in vain as a current or cannot follow the high frequency optical signal, and the frequency response characteristics of this semiconductor light receiving device are deteriorated.

When it is considered that the thickness of the light absorption layer 4 is in the order of 0.5 μm, the thickness of the contact layer 2 made of p⁺-InGaAs is so thick that is cannot be ignored so that deteriorations of the efficiency by the absorption of the contact layer 2 made of p⁺-InGaAs and the frequency response characteristics are important problems.

In this manner, in both the semiconductor light receiving device shown in FIG. 14 and the semiconductor light receiving device shown in FIG. 18, the light obliquely upward passes through the light absorption layer 4, and then passes through the upper cladding layer 3 made of p-InP so that it is influenced by the absorption in the contact layer 2 made of p⁺-InGaAs. Therefore, there occurs the problem that the conversion efficiency of the light into the electric signal and the frequency response characteristics are bad.

Furthermore, in the manufacture of these semiconductor light receiving devices, as the contact layer 2 made of p⁺-InGaAs, metals such as Ni/Zn/Au and the like are generally deposited at first.

Thereafter, the temperature is raised to near 400° C., these metals are subjected to alloying (called alloying or sintering) with the contact layer 2 made of p⁺-InGaAs so that ohmic contact can be obtained.

At this time, the metal components described above enter the inside of the contact layer 2 made of p⁺-InGaAs, and thereby the crystallinity of the contact layer 2 is deteriorated and the smoothness of the interface between the p electrode 1 and the contact layer 2 made of p⁺-InGaAs is remarkably deteriorated.

Therefore, when the light reaches these areas, many carriers which do not contribute to the photoelectric conversion by the contact layer 2 made of p⁺-InGaAs occur and the scattering loss of the light is also large, and consequently the efficiency of the photoelectric conversion and the frequency response characteristics as the semiconductor light receiving device are deteriorated.

In this manner, in the conventional semiconductor light receiving devices shown in FIG. 14 and FIG. 18, the light passes through the light absorption layer 4 according to Snell's law in geometrical optics so that there are the problems that the conversion efficiency of the light into the electric signal is low and the frequency response characteristics are deteriorated.

BRIEF SUMMARY OF THE INVENTION

The present invention is made in view of the above circumstances, and it is an object of the present invention to provide a semiconductor light receiving device in which refractive indexes of a lower cladding layer and an upper cladding layer are adjusted so that a light incident on a light absorption layer can be propagated repeatedly though the light absorption layer and a conversion efficiency of the light incident from the light absorption layer into an electric signal and the frequency response characteristics can be remarkably improved, and a method of manufacturing the same.

In order to achieve the above object, according to a first aspect of the present invention, there is provided a semiconductor light receiving device comprising:

a substrate;

a lower cladding layer which has a predetermined refractive index, is laminated on an upper portion of the substrate, and is constituted of at least one layer;

a light absorption layer laminated on an upper portion of the lower cladding layer;

an upper cladding layer which has a refractive index smaller than a refractive index of the at least one layer constituting the lower cladding layer, is laminated above the light absorption layer, and is constituted of at least one layer; and a light incident end surface which is provided at both the substrate and the lower cladding layer, and, when a light is made incident at a predetermined angle, enables the light to be absorbed in the light absorption layer and to be output as a current, wherein the light incident on both the substrate and the lower cladding layer providing the light incident end surface senses a refractive index of the lower cladding layer so that an equivalent refractive index of the light becomes larger, and the equivalent refractive index of the light becomes larger than a refractive index of the at least one layer constituting the upper cladding layer having a refractive index smaller than a refractive index of the at least one layer constituting the lower cladding layer, and the predetermined angle is an angle enabling a light incident on the light absorption layer to be reflected at a lower surface of at least one layer constituting the upper cladding layer, so that the light can be repeatedly propagated through the light absorption layer.

In order to achieve the above object, according to a second aspect of the present invention, there is provided a semiconductor light receiving device according to the first aspect, wherein, after the light is obliquely incident on the light incident end surface and is further obliquely incident on the light absorption layer to be propagated, the light is reflected at an interface of an upper side of the light absorption layer or at an interface of at least one layer constituting the upper cladding layer positioned at an upper side of the light absorption layer, and the light propagates obliquely downward through the light absorption layer again.

In order to achieve the above object, according to a third aspect of the present invention, there is provided a semiconductor light receiving device according to the first aspect, wherein an angle formed by the light incident end surface and a lower surface of the light absorption layer is 90°.

In order to achieve the above object, according to a fourth aspect of the present invention, there is provided a semiconductor light receiving device according to the first aspect, wherein an angle formed by the light incident end surface and an lower surface of the light absorption layer is less than 90°, and is greater than an angle defined by a crystal orientation of a material constituting the light incident end surface.

In order to achieve the above object, according to a fifth aspect of the present invention, there is provided a semiconductor light receiving device according to the first aspect, wherein an angle formed by the light incident end surface and a lower surface of the light absorption layer is less than 90°, and larger than an angle defined by a crystal orientation of a material constituting the light incident end surface.

In order to achieve the above object, according to a sixth aspect of the present invention, there is provided a semiconductor light receiving device according to the first aspect, wherein the lower cladding layer is made of a semiconductor material of quaternary composition.

In order to achieve the above object, according to a seventh aspect of the present invention, there is provided a semiconductor light receiving device according to the first aspect, wherein, with respect to a light incident on the light incident end surface, in order that an equivalent refractive index of the lower cladding layer is higher than a refractive index of the upper cladding layer, the lower cladding layer is formed of a combination of a layer having a higher refractive index and a layer having a lower refractive index.

In order to achieve the above object, according to an eighth aspect of the present invention, there is provided a semiconductor light receiving device according to the first aspect, wherein the lower cladding layer is made of an n type semiconductor material and the upper cladding layer is made of a p type semiconductor material.

In order to achieve the above object, according to a ninth aspect of the present invention, there is provided a semiconductor light receiving device according to the first aspect, wherein the lower cladding layer is made of a p type semiconductor material and the upper cladding layer is made of an n type semiconductor material.

In order to achieve the above object, according to a tenth aspect of the present invention, there is provided a semiconductor light receiving device according to the first aspect, wherein at least one of an incident position and an incident angle with respect to the light incident end surface of the light is adjusted so that the incident light is radiated onto the light absorption layer.

In order to achieve the above object, according to an eleventh aspect of the present invention, there is provided a semiconductor light receiving device according to the second aspect, wherein, in order to make the light obliquely incident on the light incident end surface, the semiconductor light receiving device is inclined by a wedge-shaped pedestal arranged at a lower side of the substrate.

In order to achieve the above object, according to a twelfth aspect of the present invention, there is provided a semiconductor light receiving device according to the second aspect, wherein, in order to make the light obliquely incident on the light incident end surface, a casing which holds the semiconductor light receiving device in a horizontal manner is provided so that a light is made incident obliquely into the light incident end surface from an optical fiber.

In order to achieve the above object, according to a thirteenth aspect of the present invention, there is provided a semiconductor light receiving device according to the second aspect, wherein, in order to make the light obliquely incident on the light incident end surface, a casing which holds the semiconductor light receiving device inclined by a wedge-shaped pedestal arranged at a lower side of the substrate is provided so that a light is made obliquely incident on the light incident end surface from an optical fiber.

In order to achieve the above object, according to a fourteenth aspect of the present invention, there is provided a semiconductor light receiving device according to the second aspect, wherein, in order to make the light obliquely incident on the light incident end surface, a casing which holds the semiconductor light receiving device is provided, a lens holder having a lens fixed therein is provided in the casing, and a light is made obliquely incident on the light incident end surface from an optical fiber contained in the lens holder so that at least one of a position and an inclination when an incident light is incident on the light incident end surface can be adjusted.

In order to achieve the above object, according to a fifteenth aspect of the present invention, there is provided a semiconductor light receiving device according to the fourteenth aspect, wherein the semiconductor light receiving device is inclined by a wedge-shaped pedestal arranged at a lower side of the substrate.

In order to achieve the above object, according to a sixteenth aspect of the present invention, there is provided a semiconductor light receiving device comprising:

a substrate;

a lower cladding layer, a light absorption layer and an upper cladding layer laminated on the substrate in the order;

a light incident end surface formed on both end surfaces of the substrate and the lower cladding layer; and a p electrode and an n electrode which output an electric signal generated by the fact that a light incident from the light incident end surface is absorbed in the light absorption layer to the outside via the upper cladding layer and the lower cladding layer, respectively, wherein, in order that, after the light incident on the light incident end surface is refracted at the light incident end surface and then is made obliquely incident on the light absorption layer to be propagated, the light is totally reflected at an interface of an upper side of the light absorption layer or at an interface of a semiconductor layer positioned at an upper side of the light absorption layer to be propagated obliquely downward through the light absorption layer again, a refractive index of the lower cladding layer is set to be higher than a refractive index of the upper cladding layer.

In order to achieve the above object, according to a seventeenth aspect of the present invention, there is provided a method of manufacturing a semiconductor light receiving device, comprising:

providing a substrate;

laminating a lower cladding layer having a predetermined refractive index and constituted of at least one layer on an upper portion of the substrate;

laminating a light absorption layer on an upper portion of the lower cladding layer;

laminating an upper cladding layer having a refractive index smaller than a refractive index of the at least one layer constituting the lower cladding layer and constituted of at least one layer above the light absorption layer;

making a light incident onto both the substrate and the lower cladding layer at a predetermined angle to provide a light incident end surface which enables the light to be absorbed in the light absorption layer and to be output as a current, wherein the light incident on both the substrate and the lower cladding layer providing the light incident end surface senses a refractive index of the lower cladding layer so that an equivalent refractive index of the light becomes larger, and the equivalent refractive index of the light becomes larger than a refractive index of the at least one layer constituting the upper cladding layer having a refractive index smaller than a refractive index of the at least one layer constituting the lower cladding layer, and the predetermined angle is an angle enabling a light incident on the light absorption layer to be reflected at a lower surface of the at least one layer constituting the upper cladding layer, so that the light can be repeatedly propagated through the light absorption layer.

In order to achieve the above object, according to an eighteenth aspect of the present invention, there is provided a method of manufacturing a semiconductor light receiving device according to the seventeenth aspect, wherein an angle formed by the light incident end surface and a lower surface of the light absorption layer is 90°.

In order to achieve the above object, according to a nineteenth aspect of the present invention, there is provided a method of manufacturing a semiconductor light receiving device according to the seventeenth aspect, wherein an angle formed by the light incident end surface and a lower surface of the light absorption layer is less than 90°, and is greater than an angle defined by a crystal orientation of a material constituting the light incident end surface.

In order to achieve the above object, according to a twentieth aspect of the present invention, there is provided a method of manufacturing a semiconductor light receiving device according to the seventeenth aspect, wherein an angle formed by the light incident end surface and a lower surface of the light absorption layer is less than 90°, and larger than an angle defined by a crystal orientation of a material constituting the light incident end surface.

In order to achieve the above object, according to a twenty-first aspect of the present invention, there is provided a method of manufacturing a semiconductor light receiving device according to the seventeenth aspect, wherein the lower cladding layer is made of a semiconductor material of quaternary composition.

In order to achieve the above object, according to a twenty-second aspect of the present invention, there is provided a method of manufacturing a semiconductor light receiving device according to the seventeenth aspect, wherein, with respect to a light incident into the light incident end surface, in order that an equivalent refractive index of the lower cladding layer is higher than a refractive index of the upper cladding layer, the lower cladding layer is formed of a combination of a layer having a higher refractive index and a layer having a lower refractive index.

In order to achieve the above object, according to a twenty-third aspect of the present invention, there is provided a method of manufacturing a semiconductor light receiving device according to the seventeenth aspect, wherein the lower cladding layer is made of an n type semiconductor material and the upper cladding layer is made of a p type semiconductor material.

In order to achieve the above object, according to a twenty-fourth aspect of the present invention, there is provided a method of manufacturing a semiconductor light receiving device according to the seventeenth aspect, wherein the lower cladding layer is made of a p type semiconductor material and the upper cladding layer is made of an n type semiconductor material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10 is a measurement diagram of a photocurrent shown for explaining an actual measurement result of the photocurrent by the semiconductor light receiving device according to the first embodiment of the present invention;

FIG. 11 is a diagram showing a relationship between an inclination angle $\theta_1$ from the horizon of an incident beam and a sensitivity (corresponding to a peak value in FIG. 10) experimentally obtained for explaining the actual measurement result by the semiconductor light receiving device according to the present invention;

DETAILED DESCRIPTION OF THE INVENTION

Figure 14:
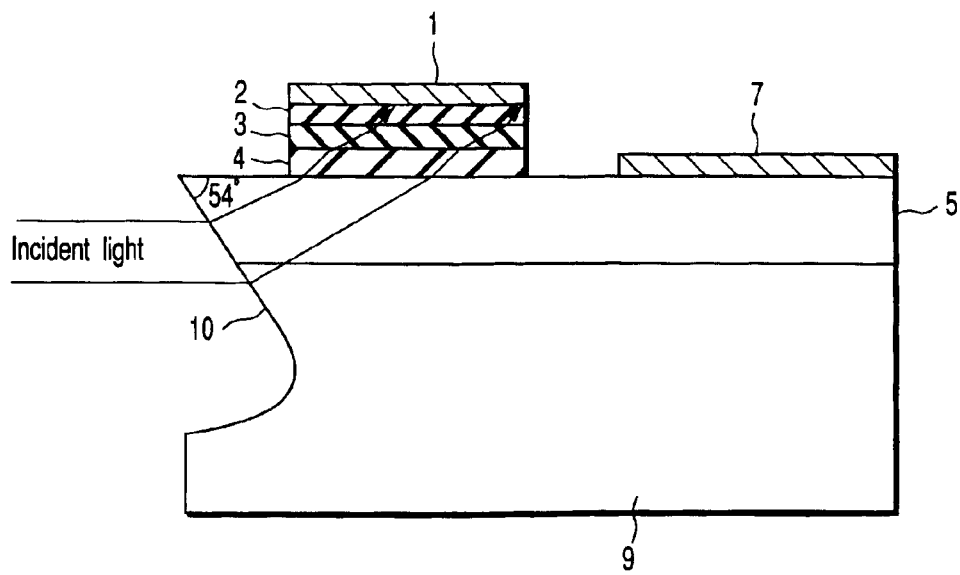
FIG. 14 is a transverse sectional view showing a schematic configuration of another conventional semiconductor light receiving device.
Figure 18:
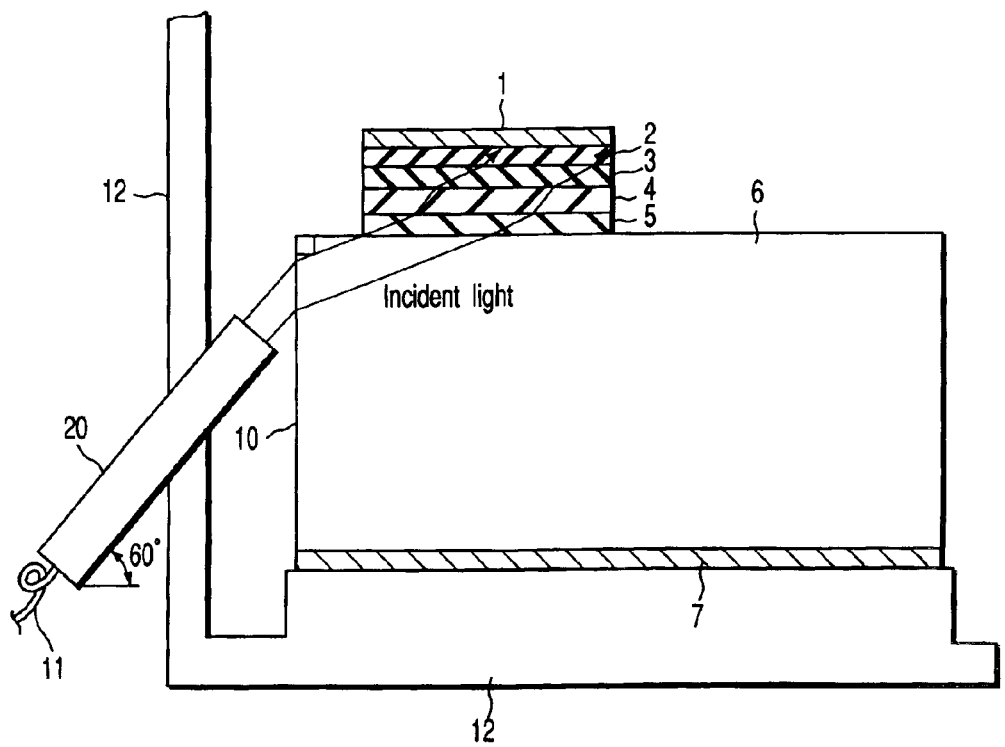
FIG. 18 is a transverse sectional view showing a schematic configuration of still another conventional semiconductor light receiving device.

First, prior to describing respective embodiments of the present invention, in order to derive basic concepts of the present invention, problems of refraction (that is, light passes through) and reflection of a light in the case of a multilayered film structure will be considered using geometrical optics used for discussion in Jpn. Pat. Appln. KOKAI Publication Nos. 11-195807 and 2000-243984 in which the conventional semiconductor light receiving devices shown in FIG. 14 and FIG. 18 are described.

Figure 1:
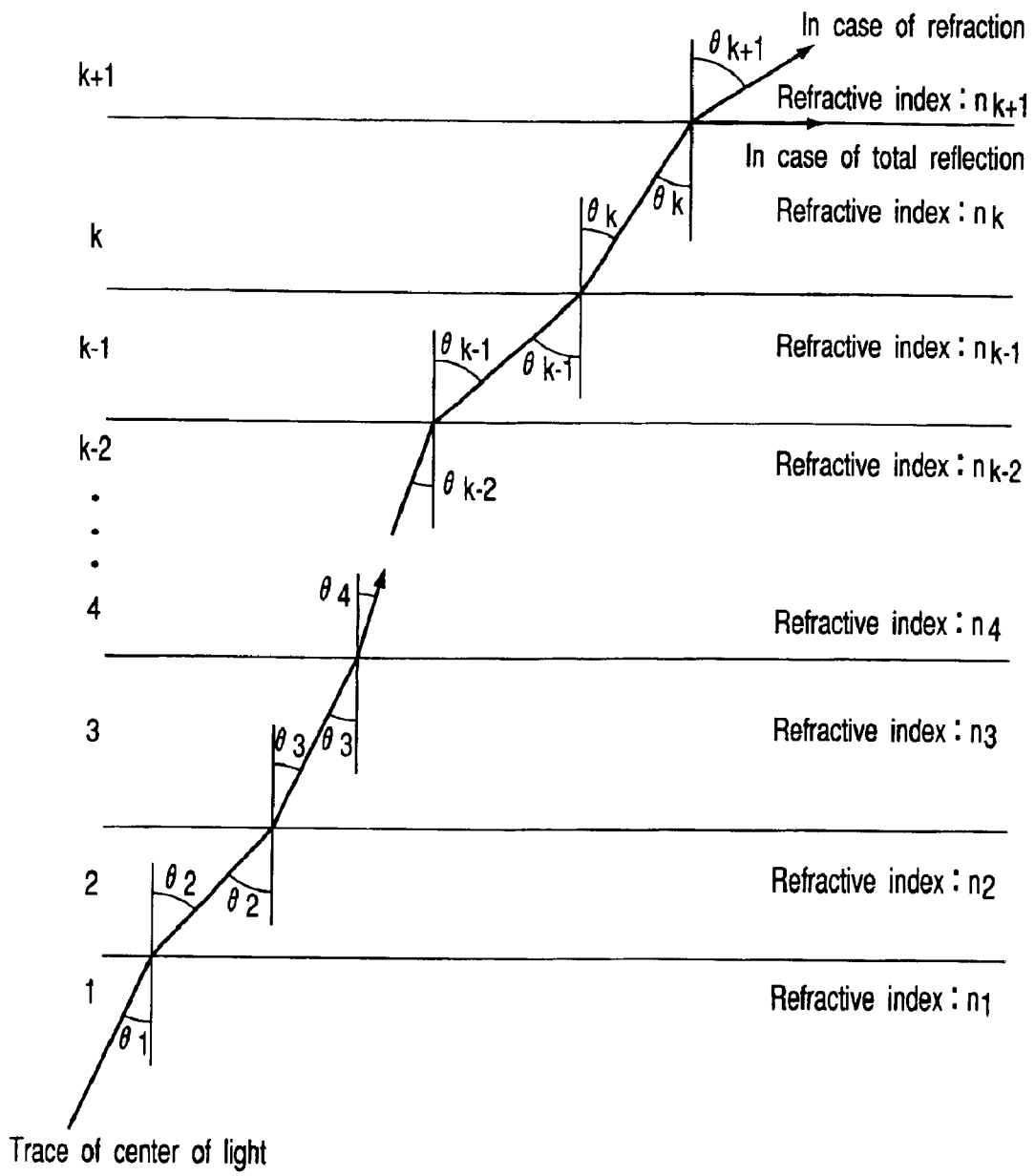
FIG. 1 is a diagram for explaining operation principles of a semiconductor light receiving device according to the present invention.

Now, as shown in FIG. 1, a multilayered film made of 1, 2, 3, . . . , k, k+1 kinds of media is considered.

If Snell's law is applied at boundaries between the respective media 1, 2, 3, . . . , k, k+1, at the boundary between the medium 1 and the medium 2, $$n_1 \sin \theta_1 = n_2 \sin \theta_2 \quad (9)$$

is obtained.

At the boundary between the medium 2 and the medium 3, $$n_2 \sin \theta_2 = n_3 \sin \theta_3 \quad (10)$$

is obtained.

At the boundary between the medium 3 and the medium 4, $$n_3 \sin \theta_3 = n_4 \sin \theta_4 \quad (11)$$

is obtained.

Hereinafter, in a similar manner, at the boundary between the medium k−2 and the medium k−1, $$n_{k-2} \sin \theta_{k-2} = n_{k-1} \sin \theta_{k-1} \quad (12)$$

is obtained.

At the boundary between the medium k−1 and the medium k, $$n_{k-1} \sin \theta_{k-1} = n_k \sin \theta_k \quad (13)$$

is obtained.

At the boundary between the medium k and the medium k+1, $$n_k \sin \theta_k = n_{k+1} \sin \theta_{k+1} \quad (14)$$

is obtained.

Further, when a procedure in which the formula (11) is substituted into the formula obtained by substituting the formula (10) into the formula (9) is repeated, the following formula (15) is finally obtained using the formula (9) to the formula (14).

$$n_1 \sin \theta_1 = n_{k+1} \sin \theta_{k+1} \quad (15)$$

In this formula (15), since $\sin \theta_{k+1} = 1$ is obtained in the case of $\theta_{k+1} = 90°$, $$n_1 \sin \theta_1 = n_{k+1} \quad (16)$$

or $$\sin \theta_1 = (n_{k+1}/n_1) < 1 \quad (17)$$

is obtained.

Here, when the real number $\theta_1$ meeting the formula (17) is present, the light is reflected at the boundary between the k layer and the k+1 layer in FIG. 1.

Specifically, when the k layer is a light absorption layer, the light which reaches the boundary between the k layer and the k+1 layer does not go outside, returns to the light absorption layer, and is absorbed again during propagating through the same.

The $\theta_1$ meeting the formula (17) is called a critical angle (in geometrical optics, it is also called a critical angle for generating total reflection).

Figure 13:
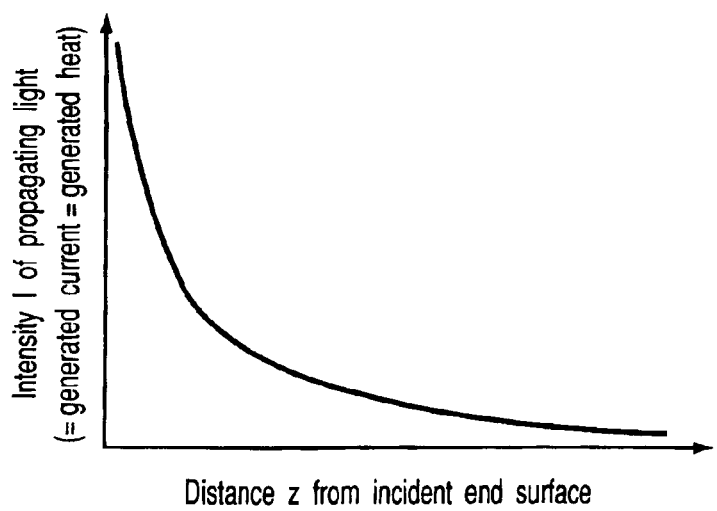
FIG. 13 is a diagram for explaining a problem of the conventional semiconductor light receiving device.
Figure 17:
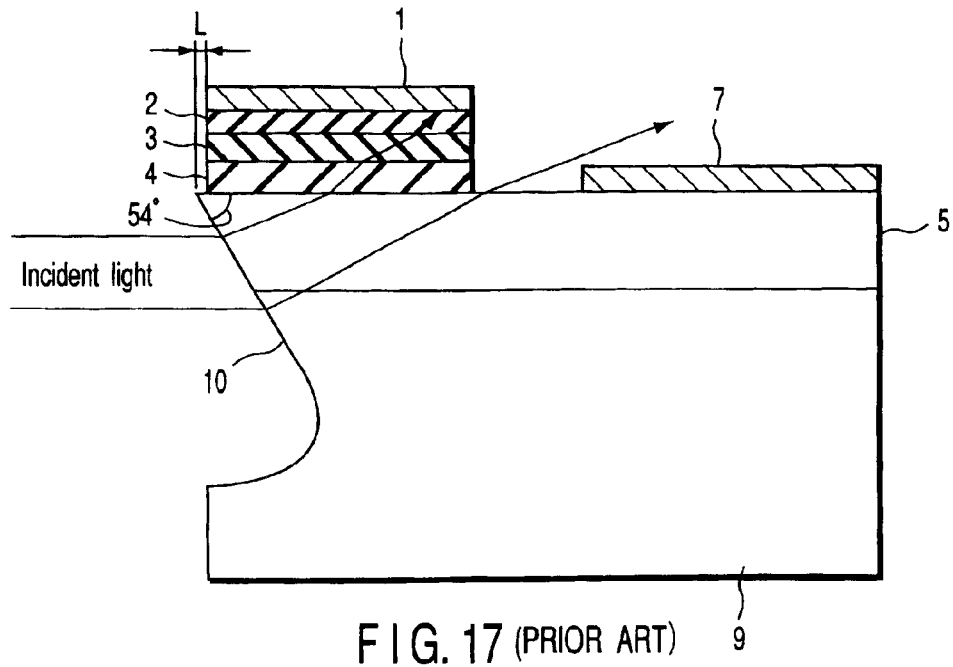
FIG. 17 is a transverse sectional view showing a schematic configuration of still another conventional semiconductor light receiving device.

Therefore, when this situation can be realized, as compared with the conventional semiconductor light receiving devices in which the light passes through the light absorption layer 4 shown in FIG. 13 or FIG. 17 and is absorbed in the contact layer 2 made of p⁺-InGaAs, the conversion efficiency of the light into the electric signal can be remarkably improved.

In the formula (17), the case of $\sin \theta_1 = 1$ corresponds to $\theta_1 = 90°$, that is the case where the light is incident in parallel to the layer, which is excluded to be considered.

Conditions under which the formula (17) is established will be considered.

As can be seen from the formula (17), the condition under which the real number $\theta_1$ is present is:

$$(n_{k+1}/n_1) < 1 \quad (18)$$

That is, when it is assumed that the total number of layers is k+1 and the light absorption layer is the k-th layer, in the case where the refractive index $n_1$ of the medium where the light is present at first is larger than the refractive index $n_{k+1}$ of the k+1-th layer, with respect to the light, the incident angle $\theta_1$ totally reflected in a geometrical-optical sense is present in the light absorption layer at the interface between the light absorption layer and the k+1-th layer.

Here, the conventional semiconductor light receiving devices shown in FIGS. 14, 18, 15, and 19 will be reconsidered.

Figure 15:
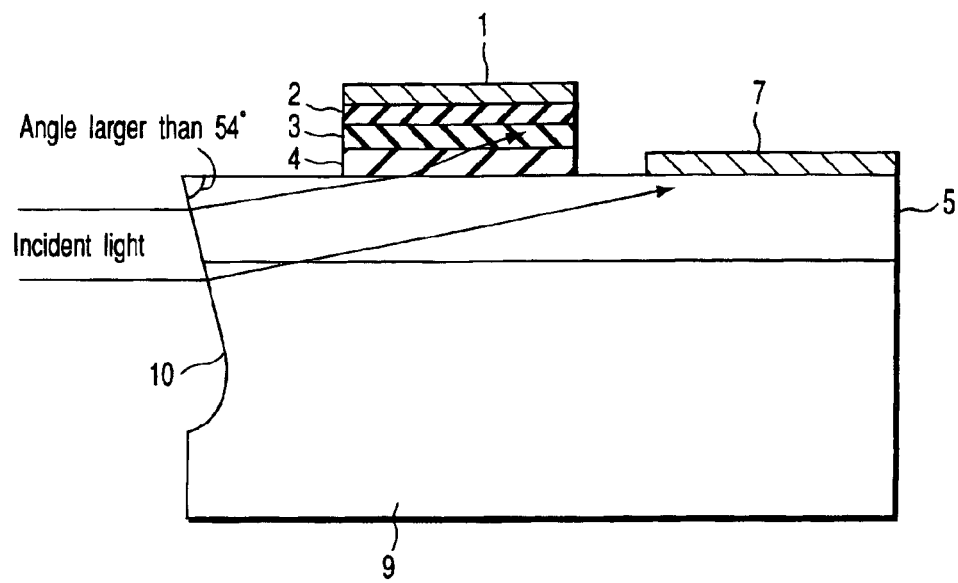
FIG. 15 is a diagram for explaining operations of another conventional semiconductor light receiving device.
Figure 16:
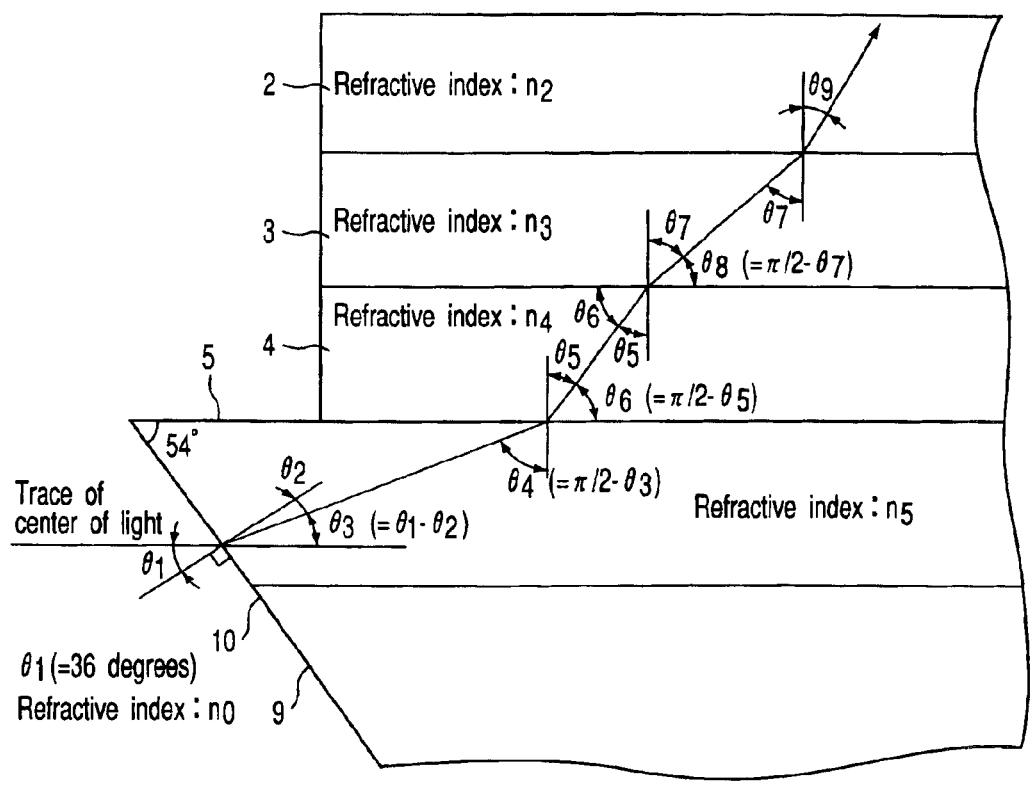
FIG. 16 is a transverse sectional view showing a schematic configuration of still another conventional semiconductor light receiving device.
Figure 19:
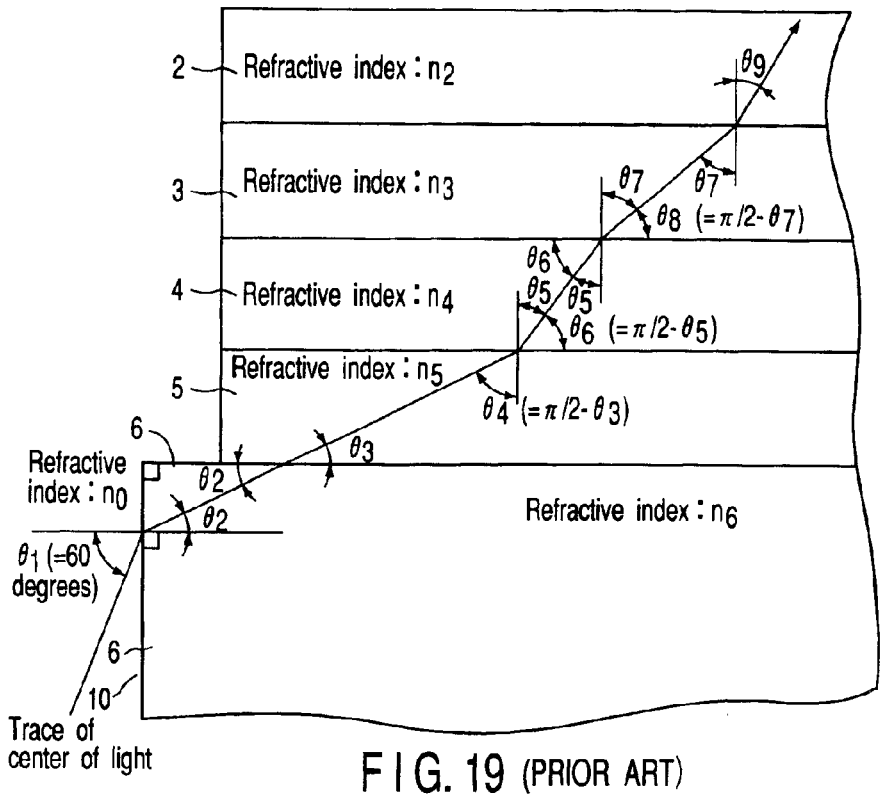
FIG. 19 is a diagram for explaining operations of still another conventional semiconductor light receiving device.

The refractive index $n_5$ of the lower cladding layer 5 made of n-InP in the semiconductor light receiving device shown in FIG. 15 and the refractive index $n_6$ of the substrate 6 made of n⁺-InP in the semiconductor light receiving device shown in FIG. 19 are 3.15, respectively, and are smaller than the refractive index $n_3$ (=3.17) of the upper cladding layer 3 made of p-InP of FIG. 15 and FIG. 19. Thereby in the conventional semiconductor light receiving devices shown in FIG. 14 and FIG. 18, the light passes through the light absorption layer 4 according to Snell's law in geometrical optics.

In other words, in these conventional semiconductor light receiving devices, it is considered as impossible in theory that the light is totally reflected at the interface between the light absorption layer 4 and the upper cladding layer 3 made of p-InP in the geometrical-optical sense.

Hereinafter, the embodiments of the present invention based on the above basic concepts will be described using the drawings.

(First Embodiment)

Figure 2:
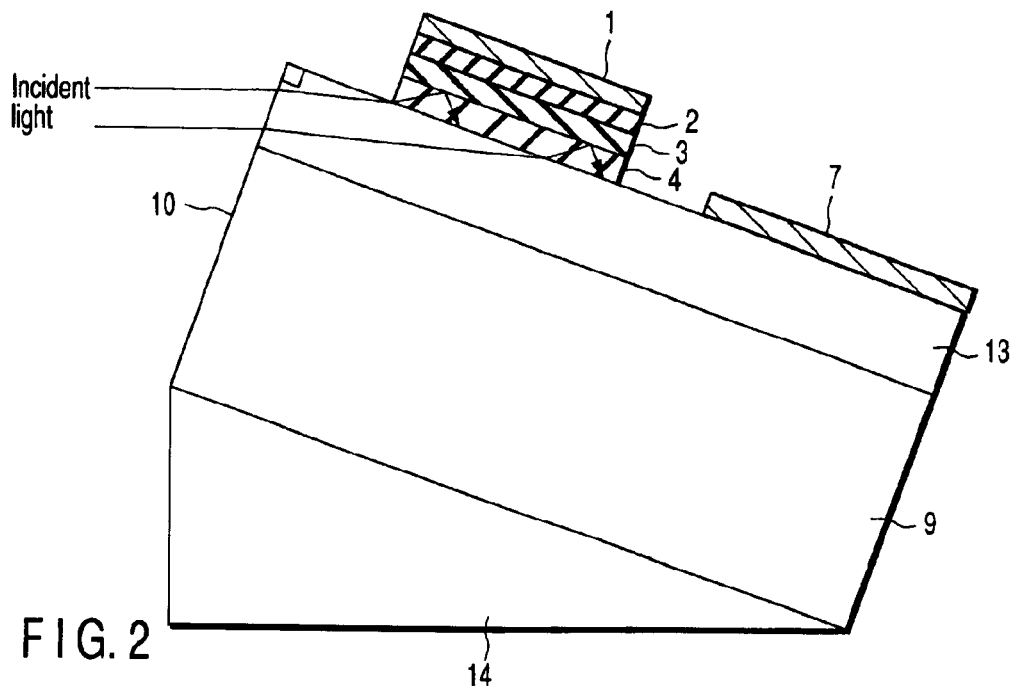
FIG. 2 is a transverse sectional view showing a schematic configuration of a semiconductor light receiving device according to a first embodiment of the present invention.

FIG. 2 is a transverse sectional view showing a schematic configuration of a semiconductor light receiving device according to a first embodiment of the present invention.

In FIG. 2, like reference numerals are denoted to like parts identical to those of the conventional semiconductor light receiving device shown in FIG. 14, and detailed description of the overlapping parts will be omitted.

In other words, as shown in FIG. 2, a lower cladding layer 13 made of n-InGaAsP, the light absorption layer 4 made of i-InGaAs, the upper cladding layer 3 made of p-InP, and the contact layer 2 made of p$^+$-InGaAs are laminated on the substrate 9 made of a semi-insulating InP (SI-InP) material.

The p type electrode 1 for extracting an electric signal is attached on the upper side of this contact layer 2.

Further, the n type electrode 7 for extracting an electric signal is similarly attached on the lower cladding layer 13 made of n-InGaAsP.

In addition, the semiconductor light receiving device is inclined by a wedge-shaped pedestal 14 arranged at the lower side of the substrate 9.

In this semiconductor light receiving device, an angle formed by the light incident end surface 10 formed of the end surfaces of the substrate 9 and the lower cladding layer 13 and the upper surface (lower surface of the light absorption layer 4) of the lower cladding layer 13 is set to be 90°.

Specifically, the light incident end surface 10 is formed by cleavage.

A material having a higher refractive index than the lower cladding layer 3 made of p-InP (refractive index $n_3$=3.17), for example, a material of quaternary composition having a band gap wavelength of 1.3 μm (refractive index $n_{13}$=3.39) is employed for the lower cladding layer 13 made of n-InGaAsP.

Note that, since the contact layer 2 made of p$^+$-InGaAs is employed in order to realize ohmic contact in the actual device, the use thereof is assumed also in this case.

Figure 3:
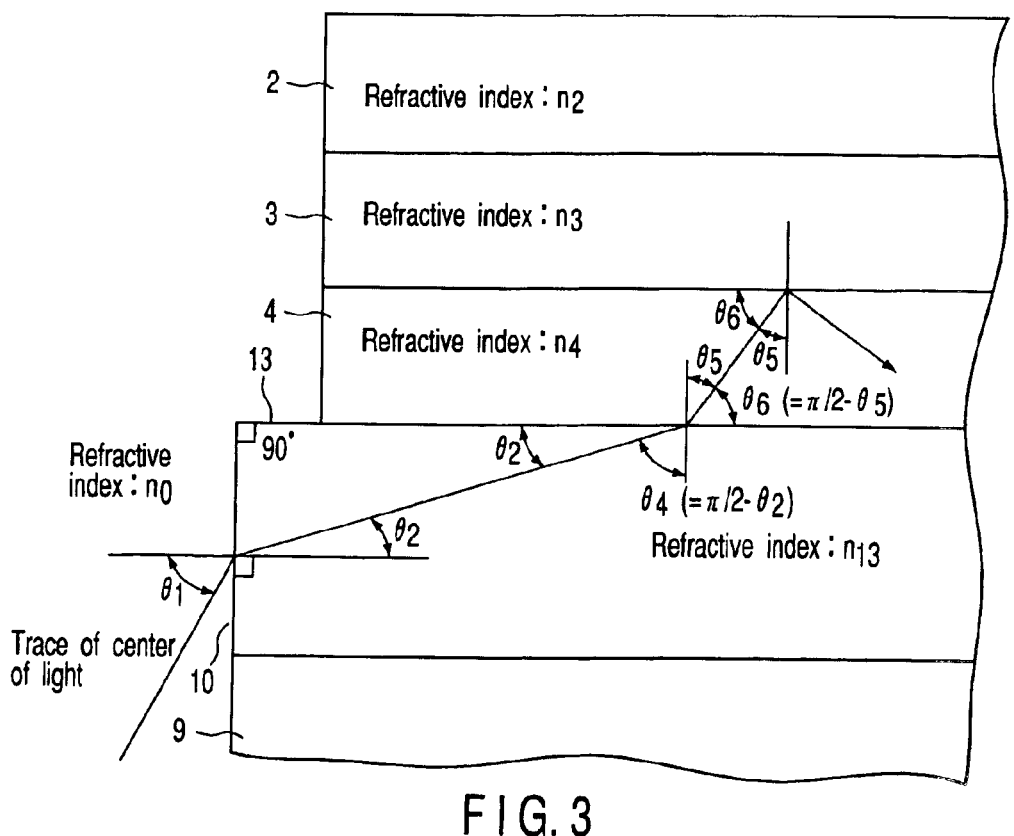
FIG. 3 is a diagram for explaining operations of the semiconductor light receiving device according to the first embodiment of the present invention.

FIG. 3 is a diagram showing a trace of the center of the light in the semiconductor light receiving device according to the first embodiment.

Here, it is important that the light is made incident in the lower cladding layer 13 made of n-InGaAsP having the refractive index higher than that of the upper cladding layer 3 made of p-InP.

Hereinafter, when Snell's law is applied at the boundaries between the respective media, in the light incident end surface 10, $$n_0 \sin \theta_1 = n_{13} \sin \theta_2 \quad (19)$$

is obtained.

At the boundary between the lower cladding layer 13 and the light absorption layer 4, $$n_{13} \sin \theta_4 = n_4 \sin \theta_5 \quad (20)$$

is obtained.

Finally, in order that the light is totally reflected at the interface between the light absorption layer 4 and the upper cladding layer 3 made of p-InP in the geometrical-optical sense, it is required that the following reflection condition obtained from Snell's law is established:

$$n_4 \sin \theta_5 = n_3 \quad (21)$$

In addition, since the refractive index $n_4$ of the light absorption layer 4 is 3.5 and the refractive index $n_3$ of the upper cladding layer 3 made of p-InP is 3.17, a critical angle $\theta_{5C}$ of $\theta_5$ in the light absorption layer 4 is $\theta_{5C}$=64.9 (or $\theta_{6C}$=π/2−64.90=25.1°) from the formula (21).

On the other hand, when the formula (21) is substituted into the formula (20), the reflection condition can be rewritten to the following formula:

$$n_{13} \sin \theta_4 = n_3 \quad (22)$$

Since the refractive index $n_3$ of the upper cladding layer 3 made of p-InP is 3.17 and the refractive index $n_{13}$ of the lower cladding layer 13 made of n-InGaAsP is 3.39, a critical angle $\theta_{4C}$ of $\theta_4$ is 69.2° (or a critical angle $\theta_{2C}$ of $\theta_2$ is 20.8°) in order that the light can obtain the reflection in the light absorption layer 4.

In other words, after the light is incident in the light incident end surface 10, when the angle $\theta_2$ formed by the refracted light and the normal line of the light incident end surface 10 is within 20.8°, the light is reflected at the interface between the light absorption layer 4 and the upper cladding layer 3 made of p-InP, and propagates through the light absorption layer 4 again to be absorbed.

As compared with the conventional semiconductor light receiving devices described above, since the inclination of the light propagating through the light absorption layer 4 in the semiconductor light receiving device according to the present embodiment is smaller as compared with the case of the conventional semiconductor light receiving devices, the effective absorption length of the light becomes longer.

Further, in the semiconductor light receiving device according to the present embodiment, the light is reflected so that the effective absorption length is multiplied and the conversion efficiency as the semiconductor light receiving device can be remarkably improved.

As one example, there will be considered a case where the incident angle $\theta_1$ with respect to the light incident end surface 10 of the light is 10°.

According to Snell's law in the light incident end surface 10, $$n_0 \sin \theta_1 = n_{13} \sin \theta_2 \quad (23)$$

is established.

When it is considered that the refractive index $n_0$ of the air is 1, $\theta_2$ in the formula (23) is 2.9°.

Therefore, $\theta_4$=π/2−$\theta_2$=87.1° is obtained.

When this $\theta_4$ is substituted into the formula (20), $\theta_5$=75.3, that is $\theta_6$=14.7 is obtained.

Therefore, in the semiconductor light receiving device according to the present embodiment, it is possible to confirm that the critical angle $\theta_{6C}$ of the reflection of the light in the light absorption layer 4 is within 25.1°.

Further, in the semiconductor light receiving device according to the present embodiment, the angle at which the light propagates through the light absorption layer 4 can be set to be smaller and the total reflection of the light in this geometrical-optical sense is employed so that the absorption efficiency of the light can be remarkably improved as compared with conventional semiconductor light receiving devices.

For example, in the semiconductor light receiving device according to the present embodiment, in the case where the incident angle $\theta_1$ is 10°, the effective absorption length of the light is 1/sin (14.7°)×2 (amount of reflection)=7.9 times the thickness of the light absorption layer 4, and thereby the absorption efficiency of the light can be remarkably improved.

As described above, since the effective absorption length of the light is about twice the thickness of the light absorption layer 4 in the conventional semiconductor light receiving devices, the semiconductor light receiving device according to the present embodiment is employed so that the absorption efficiency of the light can be remarkably improved.

Furthermore, in the semiconductor light receiving device according to the present embodiment, when the effective absorption length is assumed to be the same, the geometrical length of the light absorption layer 4 can be made shorter. Accordingly, the capacitance can be decreased and the band restricted due to the CR time constant can be remarkably improved.

In the semiconductor light receiving device according to the present embodiment, when the incident angle $\theta_1$ of the light is optimized, further improvement can be expected.

(Second Embodiment)

Figure 4:
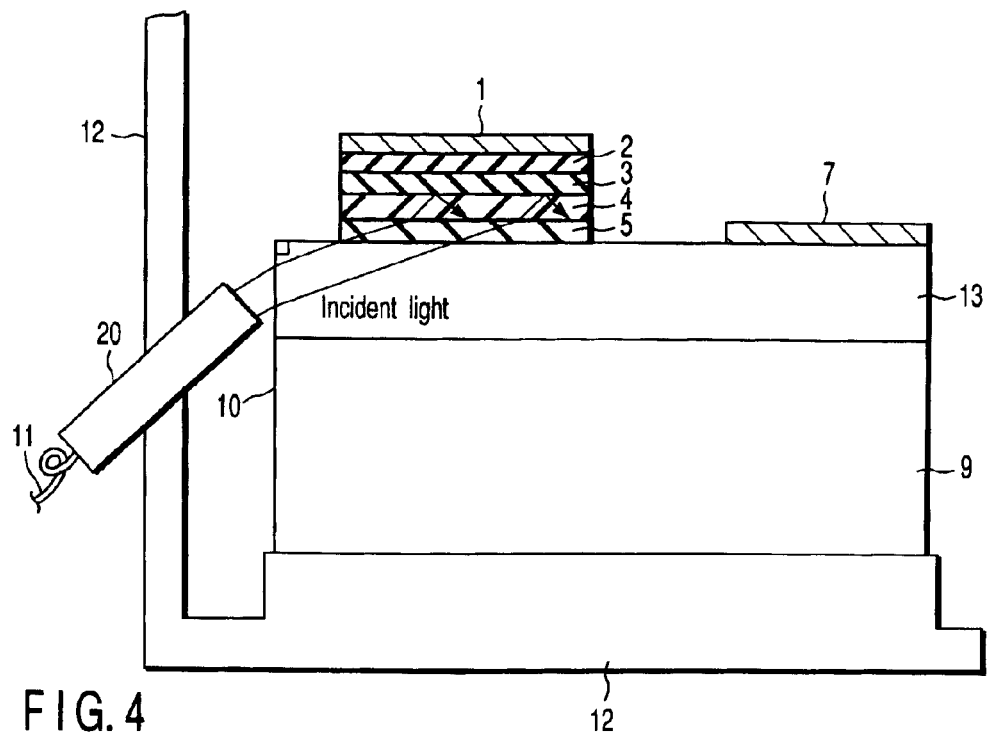
FIG. 4 is a transverse sectional view showing a schematic configuration of a semiconductor light receiving device according to a second embodiment of the present invention.

FIG. 4 is a transverse sectional view showing a schematic configuration of a semiconductor light receiving device according to a second embodiment of the present invention.

In FIG. 4, like reference numerals are denoted to like parts identical to those of the semiconductor light receiving device according to the first embodiment shown in FIG. 2, and detailed description of the overlapping parts will be omitted.

In the semiconductor light receiving device according to the second embodiment, instead of the pedestal 14 in the semiconductor light receiving device according to the first embodiment shown in FIG. 2, a casing 12 which holds the semiconductor light receiving device in a horizontal manner is provided.

The light is made incident obliquely in the light incident end surface 10 formed by the end surfaces of the substrate 9 and the lower cladding layer 13 from an optical fiber 11 supported by this casing 12.

In the semiconductor light receiving device constituted in this manner, the light incident from the optical fiber 11 into the light incident end surface 10 is refracted at this light incident end surface 10, and is incident obliquely from below in the light absorption layer 4 positioned above to be absorbed.

Also in the semiconductor light receiving device according to the second embodiment, the refractive index $n_{13}$ of the lower cladding layer 13 made of n-InGaAsP into which light is made incident is set to be higher than the refractive index $n_3$ of the upper cladding layer 3 made of p-InP positioned at the upper side of the light absorption layer 4.

Figure 20:
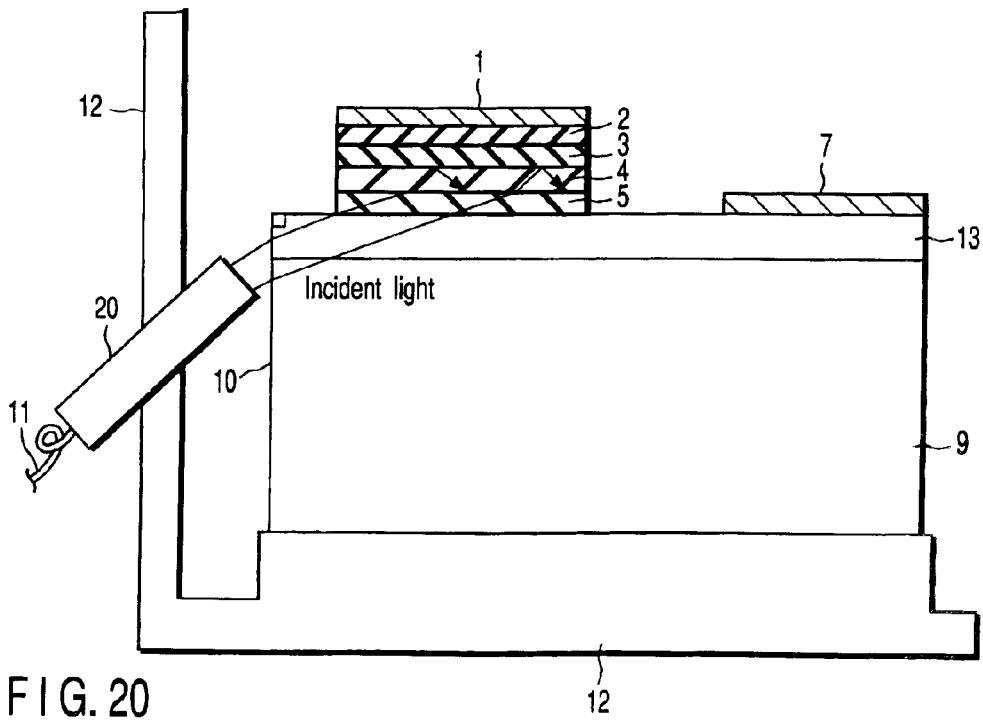
FIG. 20 is a transverse sectional view showing a schematic configuration of a semiconductor light receiving device according to a modified example of the second embodiment of the present invention.

Here, it is desirable that the light is made incident into the lower cladding layer 13 having the higher refractive index, but even when the light is made incident into both the lower cladding layer 13 and the substrate 9 in order that the equivalent refractive index for the light is set to be higher than the refractive index of the upper cladding layer 3, the present invention can be accomplished, as shown in FIG. 20 as a modified example.

The actual measurement result of the semiconductor light receiving device shown in FIG. 20 as the modified example is as follows.

In the case of the semiconductor light receiving device shown in FIG. 20 as the modified example, the thickness of the lower cladding layer 13 can be made thinner so that manufacture is facilitated.

The concept shown in FIG. 20 as the modified example can be applied not only to the second embodiment of the present invention but also to other embodiments of the present invention including the first embodiment.

In the semiconductor light receiving device according to the second embodiment, the lower cladding layer 5 made of n-InP is interposed between the light absorption layer 4 made of i-InGaAs and the lower cladding layer 13 made of n-InGaAsP.

Since, when the thickness of the lower cladding layer 5 is as thin as about 1 μm, the influence on the optical path is small, it is substantially possible to remove the lower cladding layer 5.

Therefore, since the angle of incidence of light entering the light absorption layer 4 is made smaller and the light is reflected at the interface between the upper cladding layer 3 made of p-InP (refractive index $n_3$) and the light absorption layer 4, the inclination of the light propagating through the light absorption layer 4 is smaller as compared with the conventional semiconductor light receiving devices also in the present embodiment so that the effective absorption length of the light can be made longer.

Furthermore, also in the present embodiment, since the light is reflected at the interface, the effective absorption length is multiplied so that the efficiency as the semiconductor light receiving device can be remarkably improved.

In addition, in the present embodiment, it goes without saying that the light may be made incident obliquely from below using a lens system instead of the optical fiber 11.

(Third Embodiment)

Figure 5:
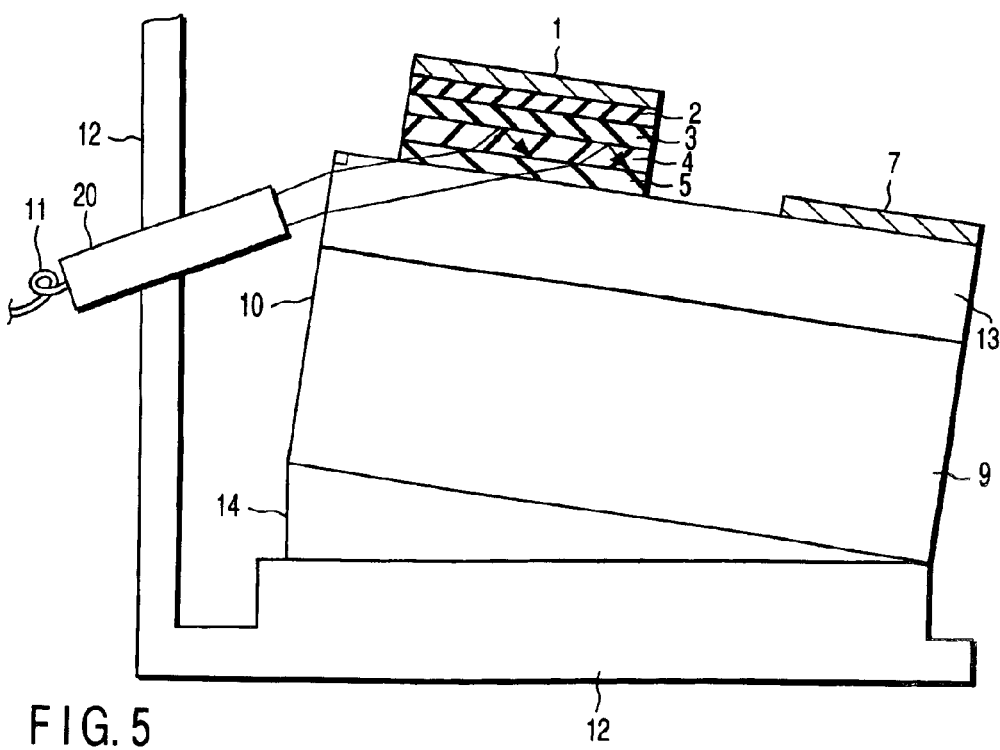
FIG. 5 is a transverse sectional view showing a schematic configuration of a semiconductor light receiving device according to a third embodiment of the present invention.

FIG. 5 is a transverse sectional view showing a schematic configuration of a semiconductor light receiving device according to a third embodiment of the present invention.

In FIG. 5, like reference numerals are denoted to like parts identical to those of the semiconductor light receiving device according to the second embodiment shown in FIG. 4, and detailed description of the overlapping parts will be omitted.

In the semiconductor light receiving device according to this third embodiment, the wedge-shaped pedestal 14 is interposed between the casing 12 in the semiconductor light receiving device according to the second embodiment shown in FIG. 4 and the substrate 9 so that the light incident end surface 10 is inclined.

In this manner, the light incident end surface 10 is inclined so that the angle of the optical fiber 11 attached to the casing 12 via a ferrule 20 becomes nearer to the horizon so that it is advantageous to easily realize a desired angle.

Also in this third embodiment, the refractive index $n_{13}$ of the lower cladding layer 13 made of n-InGaAsP into which the light is incident is set to be higher than the refractive index $n_3$ of the upper cladding layer 3 made of p-InP positioned at the upper side of the light absorption layer 4. As a result, the incident angle of the light into the light absorption layer 4 is made smaller and the light is reflected at the interface between the upper cladding layer 3 made of p-InP (refractive index $n_3$) and the light absorption layer 4.

Therefore, also in this third embodiment, the inclination of the light propagating through the light absorption layer 4 is smaller than in the case of each conventional semiconductor light receiving device described above so that the effective absorption length of the light can be made longer.

Furthermore, also in this third embodiment, since the light is reflected at the interface, the effective absorption length is multiplied and the conversion efficiency as the semiconductor light receiving device can be remarkably improved.

Additionally, also in this third embodiment, it goes without saying that the light may be made incident obliquely from below using the lens system instead of the optical fiber 11.

(Fourth Embodiment)

Figure 6:
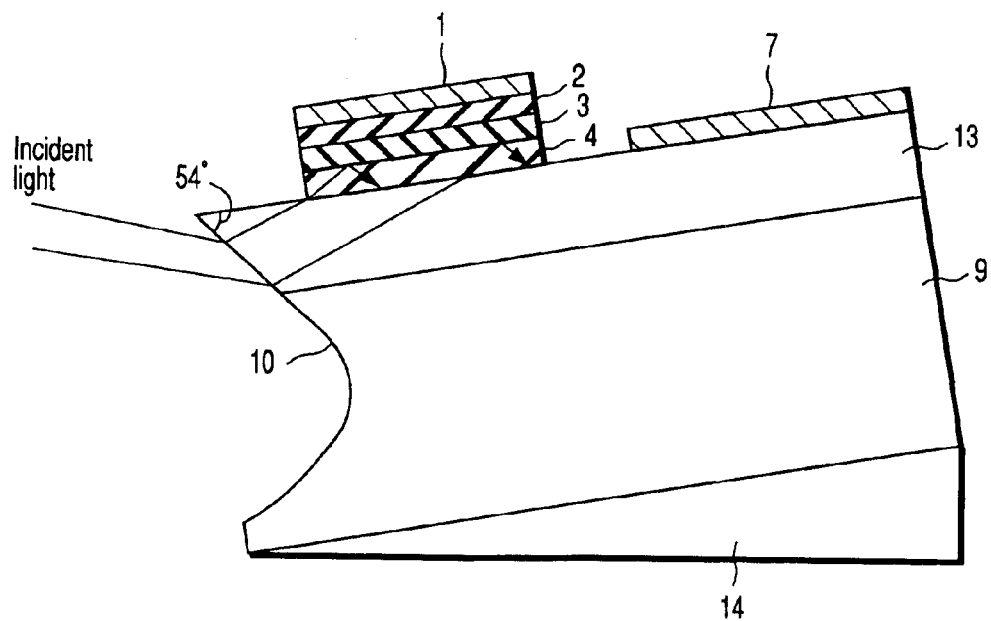
FIG. 6 is a transverse sectional view showing a schematic configuration of a semiconductor light receiving device according to a fourth embodiment of the present invention.

FIG. 6 is a transverse sectional view showing a schematic configuration of a semiconductor light receiving device according to a fourth embodiment of the present invention.

In FIG. 6, like reference numerals are denoted to like parts identical to those of the semiconductor light receiving device according to the first embodiment shown in FIG. 2, and detailed description of the overlapping parts will be omitted.

Figure 12:
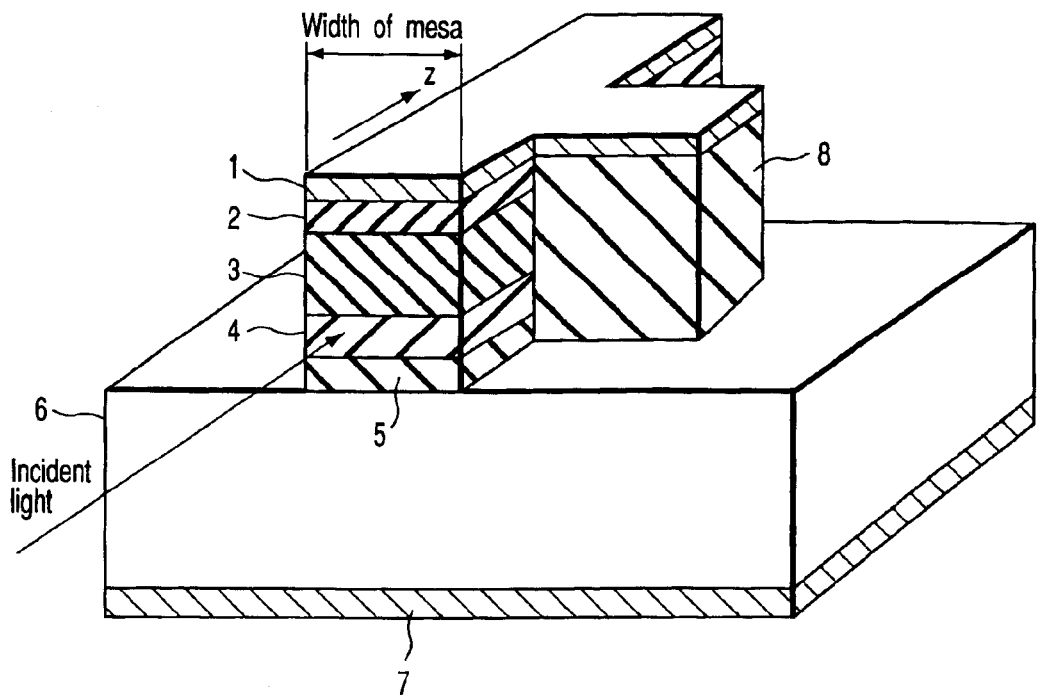
FIG. 12 is a perspective view showing a schematic configuration of a conventional semiconductor light receiving device.

In the semiconductor light receiving device according to this fourth embodiment, the light incident end surface 10 formed by the end surfaces of the substrate 9 and the lower cladding layer 13 made of n-InGaAsP is formed by wet etching as with the case of the conventional semiconductor light receiving device shown in FIG. 12.

Accordingly, the angle formed by the light incident end surface 10 and the upper surface (lower surface of the light absorption layer 4) of the lower cladding layer 13 is about 54° determined by the crystal orientation.

Furthermore, also in this fourth embodiment, in order to realize a small incident angle into the light absorption layer 4, the entire semiconductor light receiving device is inclined using the pedestal 14.

In addition, also in the semiconductor light receiving device according to this fourth embodiment, the refractive index $n_{13}$ of the lower cladding layer 13 made of n-InGaAsP into which the light is incident is set to be higher than the refractive index $n_3$ of the upper cladding layer 3 made of p-InP positioned at the upper side of the light absorption layer 4. In this way, the incident angle of the light into the light absorption layer 4 is made smaller and the light is reflected at the interface between the upper cladding layer 3 made of p-InP (refractive index $n_3$) and the light absorption layer 4.

Therefore, also in this fourth embodiment, since the inclination of the light propagating through the light absorption layer 4 is smaller than in the case of each conventional semiconductor light receiving device described above, the effective absorption length of the light can be made longer.

Furthermore, also in this fourth embodiment, since the light is reflected at the interface, the effective absorption length is multiplied so that the conversion efficiency of the semiconductor light receiving device can be remarkably improved.

(Fifth Embodiment)

Figure 7:
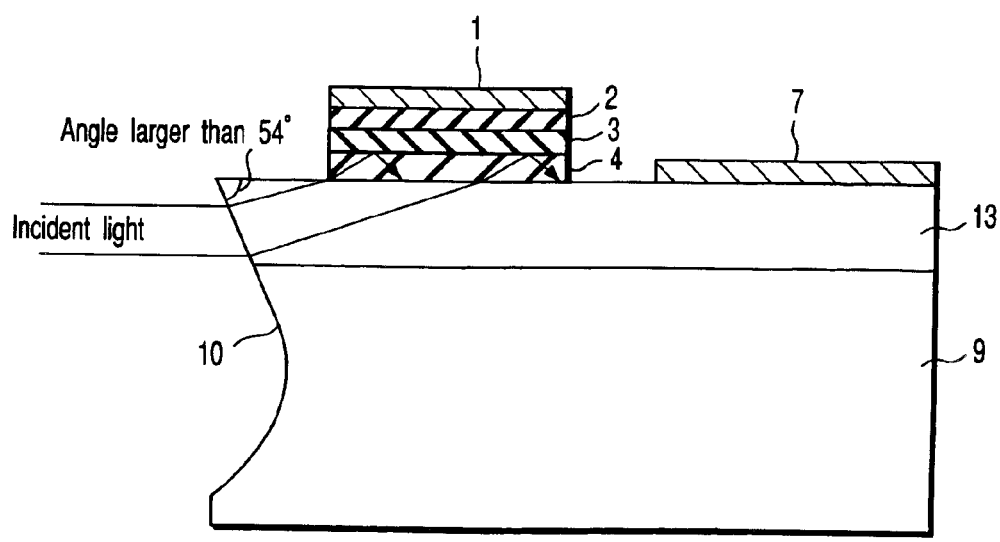
FIG. 7 is a transverse sectional view showing a schematic configuration of a semiconductor light receiving device according to a fifth embodiment of the present invention.

FIG. 7 is a transverse sectional view showing a schematic configuration of a semiconductor light receiving device according to a fifth embodiment of the present invention.

In FIG. 7, like reference numerals are denoted to like parts identical to those of the semiconductor light receiving device according to the fourth embodiment shown in FIG. 6, and detailed description of the overlapping parts will be omitted.

In the semiconductor light receiving device according to this fifth embodiment, the light incident end surface 10 formed by the end surfaces of the substrate 9 and the lower cladding layer 13 made of n-InGaAsP is formed by wet etching as with the case of the semiconductor light receiving device according to the fourth embodiment shown in FIG. 6.

However, in this fifth embodiment, the time of this wet etching is set to be shorter than the defined time.

Therefore, in the semiconductor light receiving device according to this fifth embodiment, the angle formed by the light incident end surface 10 and the upper surface (lower surface of the light absorption layer 4) of the lower cladding layer 13 is less than 90° and larger than about 54° defined by the crystal orientation.

Note that, in this case, the angle larger than about 54° can also be realized by selecting the crystal orientation.

Furthermore, in the semiconductor light receiving device according to this fifth embodiment, the refractive index $n_{13}$ of the lower cladding layer 13 made of n-InGaAsP into which the light is incident is set to be higher than the refractive index $n_3$ of the upper cladding layer 3 made of p-InP positioned at the upper side of the light absorption layer 4. In this way, the light is reflected at the interface between the upper cladding layer 3 made of p-InP (refractive index $n_3$) and the light absorption layer 4.

As one example, the inclination angle of the light incident end surface 10 (angle formed by the light incident end surface 10 and the upper surface of the light receiving device) is set to be larger than 54°, for example, 65°, and the lower cladding layer 13 made of n-InGaAsP having a band gap wavelength of 1.3 μm is employed so that the light is incident in parallel into the upper surface of the semiconductor light receiving device (upper surface of the lower cladding layer 13 or lower surface of the light absorption layer 4).

In this case, the light propagates obliquely upward at the angle of 22.8° in the light absorption layer 4.

Since this angle is smaller than the critical angle of 25.1° in which the reflection is generated in this light absorption layer 4 (this critical angle of 25.1° corresponds to the angle described as $\theta_{6C}$ when describing the first embodiment of the present invention), the light is reflected at the interface between the light absorption layer 4 and the upper cladding layer 3 made of p-InP.

As described above, not only the combination of the inclination of 65° of the light incident end surface 10 and the lower cladding layer 13 made of n-InGaAsP having the band gap wavelength of 1.3 μm but also the inclination angle of the light incident end surface 10 or the refractive index of the lower cladding layer (or cladding layer made of another material such as n-InGaAlAs having the refractive index higher than n-InP) 13 is appropriately selected so that the reflection of the light can be realized within the conditions in the wide range.

Alternatively, also in the case where the sufficient etching time is set, when the inclination of the light incident end surface 10 and the refractive index of the lower cladding layer 13 are appropriately selected, the present embodiment can be realized.

In this case, even when the inclination of the light incident end surface 10 is in the order of 58°, it is confirmed that the present embodiment can be realized.

Furthermore, the pedestal 14 required for the fourth embodiment shown in FIG. 6 is not required in the case of the fifth embodiment so that mounting is facilitated.

(Sixth Embodiment)

Figure 8:
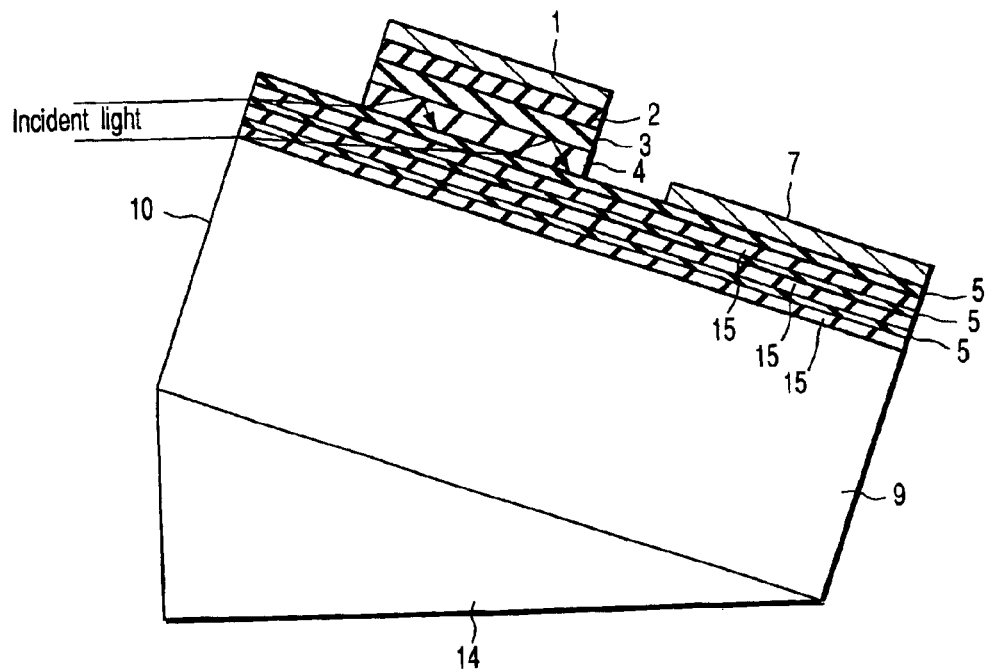
FIG. 8 is a transverse sectional view showing a schematic configuration of a semiconductor light receiving device according to a sixth embodiment of the present invention.

FIG. 8 is a transverse embodiment showing a schematic configuration of a semiconductor light receiving device according to a sixth embodiment of the present invention.

In FIG. 8, like reference numerals are denoted to like parts identical to those of the semiconductor light receiving device according to the first embodiment shown in FIG. 2, and a detailed description of the overlapping parts will be omitted.

In the semiconductor light receiving device according to this sixth embodiment, the lower cladding layer is constituted in which a plurality of lower cladding layers 15 made of n-InGaAsP and a plurality of lower cladding layer 5 made of a plurality of n-InP are alternately combined, so that, when the light is incident into this semiconductor light receiving device, the equivalent refractive index which this light senses is made larger than the refractive index of the upper cladding layer 3 made of p-InP.

In this manner, the lower cladding layer is constituted as a multilayered structure of different material. This makes it possible to improve the manufacturing efficiency by improvement of the crystallinity in the manufacturing step for forming the lower cladding layer on the substrate 9 by crystal growth.

Additionally, it goes without saying that the lower cladding layer 15 having the higher refractive index and the lower cladding layer 5 having the lower refractive index (here, n-InP is employed, but another medium may be employed) are employed as one layer, respectively, and the former may be arranged below the latter.

(Seventh Embodiment)

Figure 9:
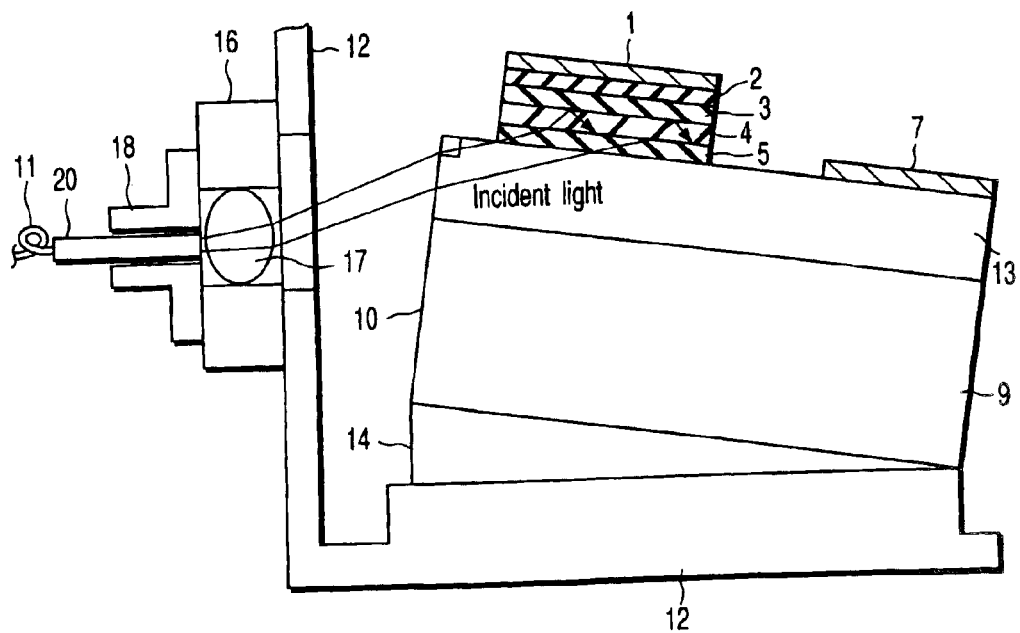
FIG. 9 is a transverse sectional view showing a schematic configuration of a semiconductor light receiving device according to a seventh embodiment of the present invention.

FIG. 9 is a transverse sectional view showing a schematic configuration of a semiconductor light receiving device according to a seventh embodiment of the present invention.

In FIG. 9, like reference numerals are denoted to like parts identical to those of the semiconductor light receiving device according to the third embodiment shown in FIG. 5, and a detailed description of the overlapping parts will be omitted.

In the semiconductor light receiving device according to this seventh embodiment, a lens 17 is fixed on a lens holder 16 and the optical fiber 11 is contained in this lens holder 16.

In this case, the optical fiber 11 is fixed on the ferrule 20, and then is contained in a holder 18.

In the semiconductor light receiving device according to this seventh embodiment, with respect to a relative positional relationship between the lens holder 16 and the ferrule 20, that is the optical fiber 11, the center of the optical fiber 11 and the center of the lens 17 are shifted in the vertical direction. Accordingly, at least one of the position and the inclination when the incident light is incident on the light incident end surface 10 can be adjusted and the incident light can be efficiently radiated on the light absorption layer 4.

The third embodiment shown in FIG. 5 is applied to the semiconductor light receiving device according to this seventh embodiment, but may of course be applied to other respective embodiments including the embodiment in which the pedestal 14 is not used.

Note that, the present invention is not limited to each embodiment described above.

In other words, in the present invention, it is a basic concept that the refractive index of the portion into which the light is incident is set to be higher than the refractive index of the cladding layer at the upper side of the light absorption layer. Therefore, all other materials having the refractive index higher than that of the upper cladding layer 3 made of p-InP can be used instead of the lower cladding layers 13 and 15 made of n-InGaAsP in all the above embodiments.

For example, it goes without saying that n-InGaAsP having the band gap wavelength of other than 1.3 μm, n-InGaAlAs, n-InAlAs, and the like may be employed.

Further, in each embodiment described above, there is constituted so that the light is reflected at the interface between the light absorption layer 4 and the upper cladding layer 3 made of p-InP, but the layer structure in which the light is reflected before it is incident into the contact layer 2 is regarded as the embodiment of the present invention.

As one example of such a layer structure, a structure is considered in which a layer having the refractive index higher than InP is formed at the upper side of the light absorption layer 4 like p-InGaAsP (or i-InGaAsP, p-InGaAlAs, or InGaAlAs) and p-InP is formed thereon.

Furthermore, in the respective embodiments described above, the cases where the lower cladding layer 5 made of n-InP is or is not at the lower side of the light absorption layer 4 are shown, but this lower cladding layer 5 made of n-InP can be eliminated.

In addition, with respect to all the embodiments of the present invention, in order that the light is made incident into the semiconductor light receiving device, it goes without saying that the lens system may be employed in addition to a rounded-end fiber, a plane fiber, and the like, and that the use wavelength may be not only 1.55 μm but also other wavelength.

Moreover, it goes without saying that, in addition to p-InGaAs, not only quaternary compound crystal such as p-InGaAsP, p-InGaAlAs, and the like but also various multi-quantum wells may be employed.

Further, the n-InP layer is assumed as the lower cladding layer 5, but i-InP may also be employed, and other materials such as InGaAsP having the refractive index higher or lower than that of the lower cladding layer 13 may be employed.

In each embodiment of the present invention shown in FIG. 1 to FIG. 9, the figures are depicted such that the distance from the edge of the upper side of the light incident end surface 10 to the end surface of the light absorption layer 4 is not zero, but actually it is enough that the light is efficiently radiated on the light absorption layer 4 so that this distance may be or may not be zero.

In each embodiment of the present invention described above, the light absorption layer 4 has a high-mesa structure, but a semi-insulating InP or pn embedded structure may be employed.

Further, for the substrate, description is made mainly when the semi-insulating InP substrate is assumed, but n$^+$-InP substrate may of course be employed.

In addition, the n type or n$^+$type semiconductor layer may be formed on the light absorption layer 4 and the p type or p$^+$type semiconductor layer may be formed below the light absorption layer using the fact that the n type semiconductor having high concentration has the slightly smaller refractive index.

For example, there is considered a case where the n$^+$-InP cladding layer is formed on the light absorption layer.

In this case, in each embodiment described above, it goes without saying that the contact layer 2 may be formed of n$^+$-InGaAs, the upper cladding layer 3 may be formed of n$^+$InP, the lower cladding layer 5 may be formed of p-InP (other material such as InGaAsP or the like may be employed in addition to InP) (provided that this layer may or may not be employed), the lower cladding layer 13 may be formed of p-InP or p-InP, and the p-InGaAsP layer or the p$^+$-InGaAsP layer may be formed of any material including the semi-insulating InP if the refractive index can be made higher.

Furthermore, the substrate 9 and the lower cladding layer 13 are regarded as integrated so that the p$^+$-InP substrate may be used.

In the description so far, it is assumed that the lower cladding layer 13 is entirely doped into the same type, but only part thereof need be doped.

Moreover, for alloying when the ohmic contact is realized, the contact layer 2 made of p$^+$-InGaAs is deteriorated in the crystallinity and the smoothness of the interface between the p type electrode 1 and the contact layer 2 made of p$^+$-InGaAs is remarkably deteriorated.

However, in the present invention, the light propagating obliquely upward from the lower side is reflected obliquely downward at the interface of the semiconductor layers, the light is not easy to be influenced by the p$^+$-InGaAs contact layer 2, or the p type electrode 1 and the p$^+$-InGaAs contact layer 2 so that the efficiency of the photoelectric conversion and the frequency response characteristics are remarkably good.

Here, the actual measurement result of the semiconductor light receiving device according to the first embodiment of the present invention shown in FIG. 2 will be described with reference to FIG. 10.

In addition, this actual measurement result can similarly be applied to all other embodiments including the modified example in FIG. 20.

In other words, FIG. 10 shows measurement values of a photocurrent obtained when the rounded-end fiber is moved upward from the substrate 9 side along the light incident end surface 10 in the case where the inclination $\theta_1$ of the incident light is 35° (the incident light is directed from obliquely lower left to obliquely upper right as shown in FIG. 3).

In this case, the power of the input light is −8.1 dBm.

As the rounded-end fiber is moved upward along the light incident end surface 10 from the substrate 9 side, when the light emitted from the rounded-end fiber starts to sense the high refractive index of the lower cladding layer 13 made of n-InGaAsP in addition to the substrate 9 shown in FIG. 3 (FIG. 20), the equivalent refractive index of the incident light becomes higher.

As a result, the equivalent refractive index of the incident light becomes higher than the refractive index $n_3$ of the upper cladding layer 3 made of p-InP positioned above the light absorption layer 4, and the light is reflected at the boundary between the light absorption layer 4 made of i-InGaAs and the upper cladding layer 3 made of p-InP, and thereby the efficiency can be remarkably improved.

Here, the thickness of the light absorption layer 4 is 0.4 µm.

Note that, in this experiment, the end surfaces of the light absorption layer 4, the upper cladding layer 3, and the contact layer 2 and the light incident end surface 10 employ the device positioned on the same plane.

That is to say, in this device, the distance from the edge of the light incident end surface 10 to the light absorption layer 4 is zero.

Further, FIG. 11 shows a relationship between the inclination angle $\theta_1$ from the horizon of the incident beam and the sensitivity (corresponding to the peak value in FIG. 10) experimentally obtained.

From FIG. 11, it is found that $\theta_1$ becomes larger in the vicinity of 20° to 50° and the high sensitivity of about 0.7 A/W without anti-reflection coating (not less than 0.9 A/W with anti-reflection coating).

It is considered that the fact that the efficiency is low at small $\theta_1$ from 5° to 10° is because the amount of light entering the light absorption layer 4 is decreased due to Fresnel reflection caused by the difference of the refractive indexes of the light absorption layer 4 and the lower cladding layer 13.

As described above, in the semiconductor light receiving device according to the present invention, the refractive index of the lower cladding layer, on which the light is incident, is set to be higher than the refractive index of the upper cladding layer positioned at the upper side of the light absorption layer.

Therefore, in the semiconductor light receiving device according to the present invention, the incident angle of the light into the light incident end surface is set such that the incident angle on the light absorption layer becomes smaller. Accordingly, the light incident on the light absorption layer can be repeatedly propagated through the light absorption layer and the conversion efficiency of the light incident from the light incident end surface into the electric signal and the frequency response characteristics can be remarkably improved.

According to the present invention described above, it is possible to provide a semiconductor light receiving device in which the refractive indexes of the lower cladding layer and the upper cladding layer are adjusted so that the light incident on the light absorption layer can be repeatedly propagated through the light absorption layer and the conversion efficiency of the light incident from the light incident end surface into the electric signal and the frequency response characteristics can be remarkably improved, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light receiving device comprising:

a substrate;

a lower cladding layer which has a predetermined refractive index, is laminated on an upper portion of the substrate, and is constituted of at least one layer;

a light absorption layer laminated on an upper portion of the lower cladding layer;

an upper cladding layer which has a refractive index smaller than a refractive index of said at least one layer constituting the lower cladding layer, is laminated above the light absorption layer, and is constituted of at Least one layer; and a light incident end surface which is provided at both the substrate and the lower cladding layer, and, when a light is made incident at a predetermined angle, enables the light to be absorbed in the light absorption layer and to be output as a current, wherein the light incident on both the substrate and the lower cladding layer providing the light incident end surface senses a refractive index of the lower cladding layer so that an equivalent refractive index of the light becomes larger, and the equivalent refractive index of the light becomes larger than a refractive index of said at least one layer constituting the upper cladding layer having a refractive index smaller than a refractive index of said at least one layer constituting the lower cladding layer, and the predetermined angle is an angle enabling a light incident on the light absorption layer to be reflected at a lower surface of at least one layer constituting the upper cladding layer, so that the light can be repeatedly propagated through the light absorption layer.

2. A semiconductor light receiving device according to claim 1, wherein, after the light is obliquely incident on the light incident end surface and is further obliquely incident on the light absorption layer to be propagated, the light is reflected at an interface of an upper side of the light absorption layer or at an interface of at least one layer constituting the upper cladding layer positioned at an upper side of the light absorption layer, and the light propagates obliquely downward through the light absorption layer again.

3. A semiconductor light receiving device according to claim 1, wherein an angle formed by the light incident end surface and a lower surface of the light absorption layer is 90°.

4. A semiconductor light receiving device according to claim 1, wherein an angle formed by the light incident end surface and an lower surface of the light absorption layer is less than 90°, and is greater than an angle defined by a crystal orientation of a material constituting the light incident end surface.

5. A semiconductor light receiving device according to claim 1, wherein an angle formed by the light incident end surface and a lower surface of the light absorption layer is less than 90°, and larger than an angle defined by a crystal orientation of a material constituting the light incident end surface.

6. A semiconductor light receiving device according to claim 1, wherein the lower cladding layer is made of a semiconductor material of quaternary composition.

7. A semiconductor light receiving device according to claim 1, wherein, with respect to a light incident on the light incident end surface, in order that an equivalent refractive index of the lower cladding layer is higher than a refractive index of the upper cladding layer, the lower cladding layer is formed of a combination of a layer having a higher refractive index and a layer having a lower refractive index.

8. A semiconductor light receiving device according to claim 1, wherein the lower cladding layer is made of an n type semiconductor material and the upper cladding layer is made of a p type semiconductor material.

9. A semiconductor light receiving device according to claim 1, wherein the lower cladding layer is made of a p type semiconductor material and the upper cladding layer is made of an n type semiconductor material.

10. A semiconductor light receiving device according to claim 1, wherein at least one of an incident position and an incident angle with respect to the light incident end surface of the light is adjusted so that the incident light is radiated onto the light absorption layer.

11. A semiconductor light receiving device according to claim 2, wherein, in order to make the light obliquely incident on the light incident end surface, the semiconductor light receiving device is inclined by a wedge-shaped pedestal arranged at a lower side of the substrate.

12. A semiconductor light receiving device according to claim 2, wherein, in order to make the light obliquely incident on the light incident end surface, a casing which holds the semiconductor light receiving device in a horizontal manner is provided so that a light is made incident obliquely into the light incident end surface from an optical fiber.

13. A semiconductor light receiving device according to claim 2, wherein, in order to make the light obliquely incident on the light incident end surface, a casing which holds the semiconductor light receiving device inclined by a wedge-shaped pedestal arranged at a lower side of the substrate is provided so that a light is made obliquely incident on the light incident end surface from an optical fiber.

14. A semiconductor light receiving device according to claim 2, wherein, in order to make the light obliquely incident on the light incident end surface, a casing which holds the semiconductor light receiving device is provided, a lens holder having a lens fixed therein is provided in the casing, and a light is made obliquely incident on the light incident end surface from an optical fiber contained in the lens holder so that at least one of a position and an inclination when an incident light is incident, on the light incident end surface can be adjusted.

15. A semiconductor light receiving device according to claim 14, wherein the semiconductor light receiving device is inclined by a wedge-shaped pedestal arranged at a lower side of the substrate.

16. A method of manufacturing a semiconductor light receiving device, comprising:
   providing a substrate;
   laminating a lower cladding layer having a predetermined refractive index and constituted of at least one layer on an upper portion of the substrate;
   laminating a light absorption layer on an upper portion of the lower cladding layer;
   laminating an upper cladding layer having a refractive index smaller than a refractive index of said at least one layer constituting the lower cladding layer and constituted of at least one layer above the light absorption layer;
   making a light incident on both the substrate and the lower cladding layer at a predetermined angle to provide a light incident end surface which enables the light to be absorbed in the light absorption layer and to be output as a current,
   wherein the light incident on both the substrate and the lower cladding layer providing the light incident end surface senses a refractive index of the lower cladding layer so that an equivalent refractive index of the light becomes larger, and the equivalent refractive index of the light becomes larger than a refractive index of said at least one layer constituting the upper cladding layer having a refractive index smaller than a refractive index of said at best one layer constituting the lower cladding layer, and
   the predetermined angle is an angle enabling a light incident on the light absorption layer to be reflected at a lower surface of said at least one layer constituting the upper cladding layer,
   so that the light can be repeatedly propagated through the light absorption layer.

17. A method of manufacturing a semiconductor light receiving device according to claim 16, wherein an angle formed by the light incident end surface and a lower surface of the light absorption layer is 90°.

18. A method of manufacturing a semiconductor light receiving device according to claim 16, wherein an angle formed by the light incident end surface and a lower surface of the light absorption layer is less than 90°, and is greater than an angle defined by a crystal orientation of a material constituting the light incident end surface.

19. A method of manufacturing a semiconductor light receiving device according to claim 16, wherein an angle formed by the light incident end surface and a lower surface of the light absorption layer is loss than 90°, and larger than an angle defined by a crystal orientation of a material constituting the light incident end surface.

20. A method of manufacturing a semiconductor light receiving device according to claim 16, wherein the lower cladding layer is made of semiconductor material of quaternary compositor.

21. A method of manufacturing a semiconductor light receiving device according to claim 16, wherein, with respect to a light incident on the light incident end surface, in order that an equivalent refractive index of the lower cladding layer is higher than a refractive index of the upper cladding layer, the lower cladding layer is made of a combination of a layer having a higher refractive index and a layer having a lower refractive index.

22. A method of manufacturing a semiconductor light receiving device according to claim 16, wherein the lower cladding layer is made of an n type semiconductor material and the upper cladding layer is made of a p type semiconductor material.

23. A method of manufacturing a semiconductor light receiving device according to claim 16, wherein the lower cladding layer is made of a p type semiconductor material and the upper cladding layer is made of an n type semiconductor material.

* * * * *